(12) United States Patent
Amano et al.

(10) Patent No.: US 7,339,200 B2
(45) Date of Patent: Mar. 4, 2008

(54) LIGHT-EMITTING DIODE AND VEHICULAR LAMP

(75) Inventors: Yasuyuki Amano, Shizuoka (JP);
Tsutomu Machida, Shizuoka (JP);
Hiroya Koizumi, Shizuoka (JP)

(73) Assignee: Koito Manufacturing Co., Ltd., Tokyo (JP)

( * ) Notice: Subject to any disclaimer, the term of this patent is extended or adjusted under 35 U.S.C. 154(b) by 1 day.

(21) Appl. No.: 11/497,044

(22) Filed: Aug. 1, 2006

(65) Prior Publication Data

US 2007/0029563 A1 Feb. 8, 2007

(30) Foreign Application Priority Data

Aug. 5, 2005 (JP) ............................. 2005-228519

(51) Int. Cl.
*H01L 31/18* (2006.01)
(52) U.S. Cl. ............... 257/98; 257/E33.073; 362/494; 362/522; 362/267; 362/309; 362/335; 362/338
(58) Field of Classification Search .............. 257/98, 257/E33.073; 362/494, 522, 267, 309, 335, 362/338
See application file for complete search history.

(56) References Cited

U.S. PATENT DOCUMENTS

| | | | | |
|---|---|---|---|---|
| 4,213,171 A | * | 7/1980 | Sassmannshausen | 362/310 |
| 4,961,622 A | * | 10/1990 | Gorman et al. | 385/33 |
| 5,440,456 A | * | 8/1995 | Bertling et al. | 362/520 |
| 5,535,230 A | * | 7/1996 | Abe | 372/50.23 |
| 5,836,674 A | * | 11/1998 | Nishitani et al. | 362/336 |
| 5,902,032 A | * | 5/1999 | Hannigan et al. | 353/38 |
| 6,070,993 A | * | 6/2000 | Natsume | 362/309 |
| 6,139,173 A | * | 10/2000 | Hanamori | 362/522 |
| 6,578,989 B2 | * | 6/2003 | Osumi et al. | 362/298 |
| 6,623,150 B2 | * | 9/2003 | Roller et al. | 362/520 |
| 7,111,964 B2 | * | 9/2006 | Suehiro et al. | 362/328 |
| 7,134,768 B2 | * | 11/2006 | Suzuki | 362/241 |
| 7,244,924 B2 | * | 7/2007 | Kiyomoto et al. | 250/216 |
| 7,258,473 B2 | * | 8/2007 | Okamura et al. | 362/545 |
| 2002/0041498 A1 | * | 4/2002 | Furst et al. | 362/494 |
| 2002/0085390 A1 | * | 7/2002 | Kiyomoto et al. | 362/555 |

(Continued)

FOREIGN PATENT DOCUMENTS

JP 2001-283616 10/2001

(Continued)

*Primary Examiner*—George Fourson
(74) *Attorney, Agent, or Firm*—William L. Androlia; H. Henry Koda

(57) ABSTRACT

A light-emitting diode including a curved surface portion 14aA formed in the front face of a sealing member 14 with the cross-sectional shape of the curved surface portion being in the shape of an undulating curve that has a concave curve C1 near the optical axis and convex curves C2 on both sides of concave curve C1, thus allowing the light emitted from a light-emitting chip 12 at a small divergence angle centered on the optical axis Ax to reach the concave curve C1 and to be directed forward as diffused light deflected from the optical axis and further allowing the light emitted at a large divergence angle centered on the optical axis Ax to reach the convex curves C2 and to be directed forward as light deflected toward line L positioned at the divergence angle θ.

8 Claims, 17 Drawing Sheets

U.S. PATENT DOCUMENTS

| | | |
|---|---|---|
| 2003/0165065 A1* | 9/2003 | Roller et al. ................. 362/522 |
| 2003/0218882 A1* | 11/2003 | Wirth et al. ................. 362/329 |
| 2004/0170018 A1* | 9/2004 | Nawashiro .................. 362/244 |
| 2004/0207999 A1* | 10/2004 | Suehiro et al. ................ 362/84 |
| 2005/0212089 A1* | 9/2005 | Kiyomoto et al. .......... 257/601 |
| 2006/0124835 A1* | 6/2006 | Kiyomoto et al. .......... 250/216 |
| 2007/0029563 A1* | 2/2007 | Amano et al. ................. 257/98 |
| 2007/0030688 A1* | 2/2007 | Amano et al. .............. 362/521 |

FOREIGN PATENT DOCUMENTS

JP      2002-094129      3/2002

* cited by examiner

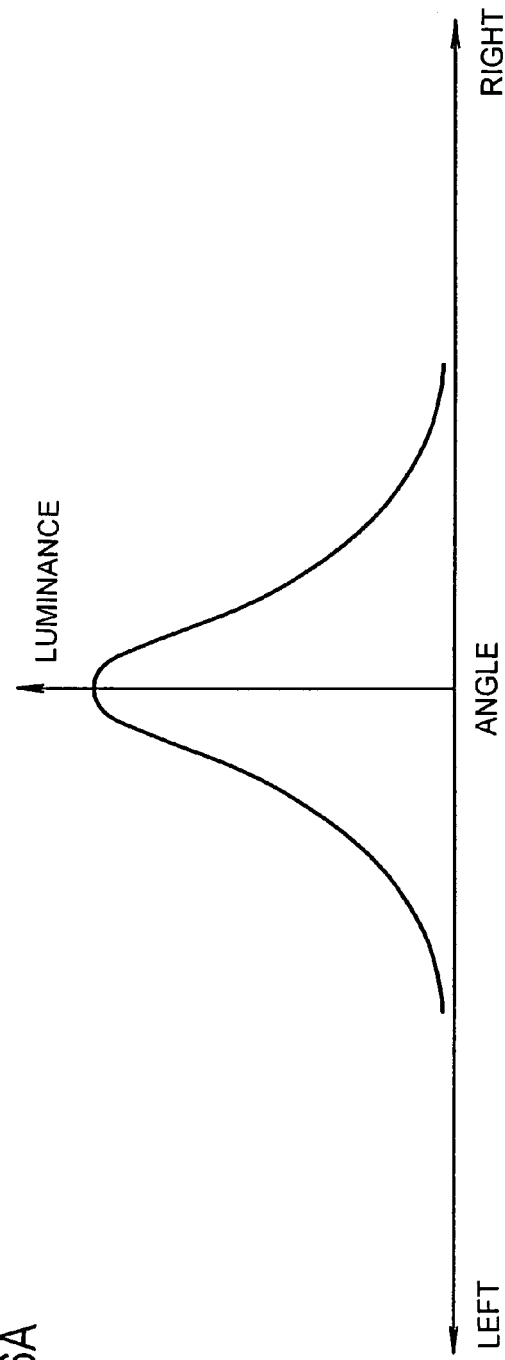
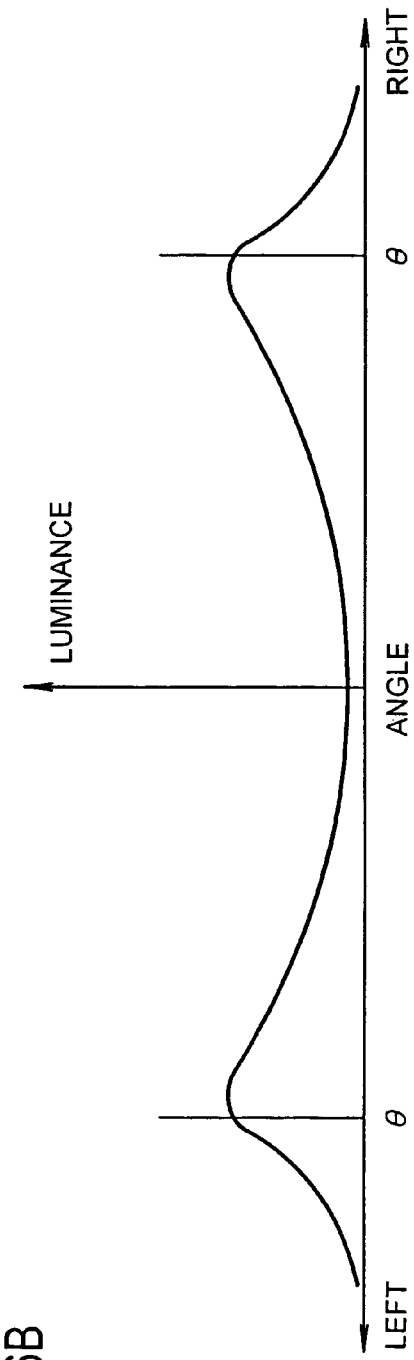
FIG. 6B
FIG. 6A

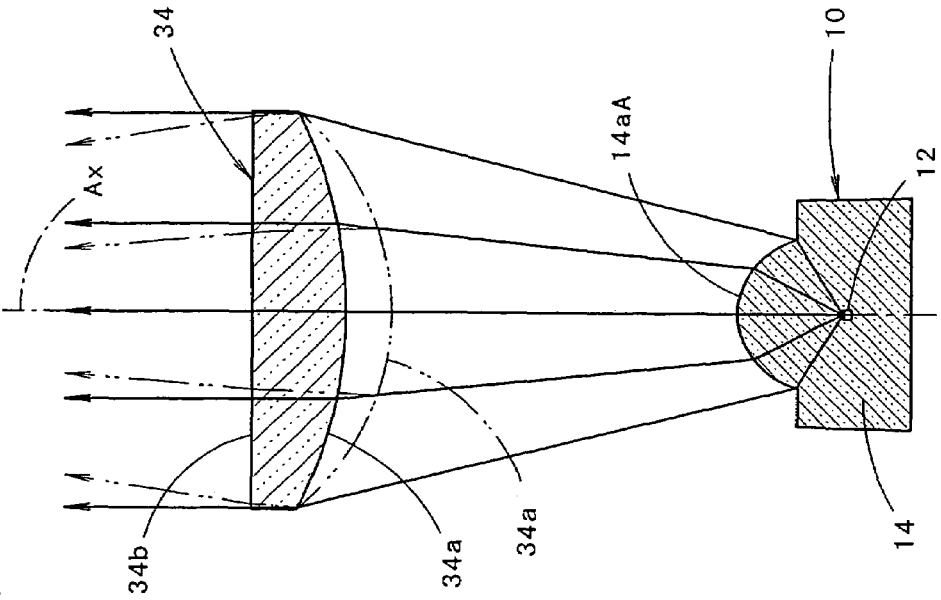
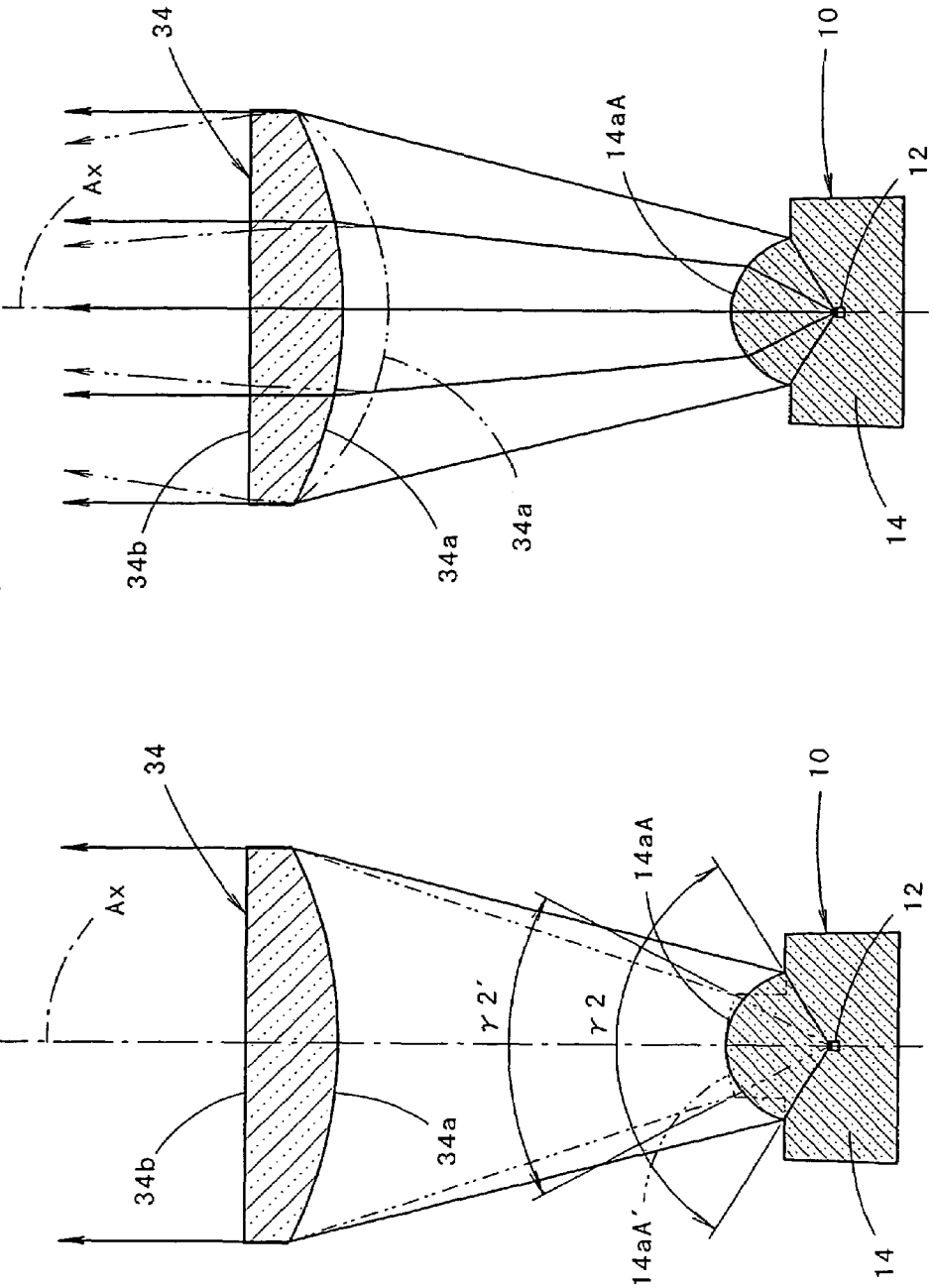

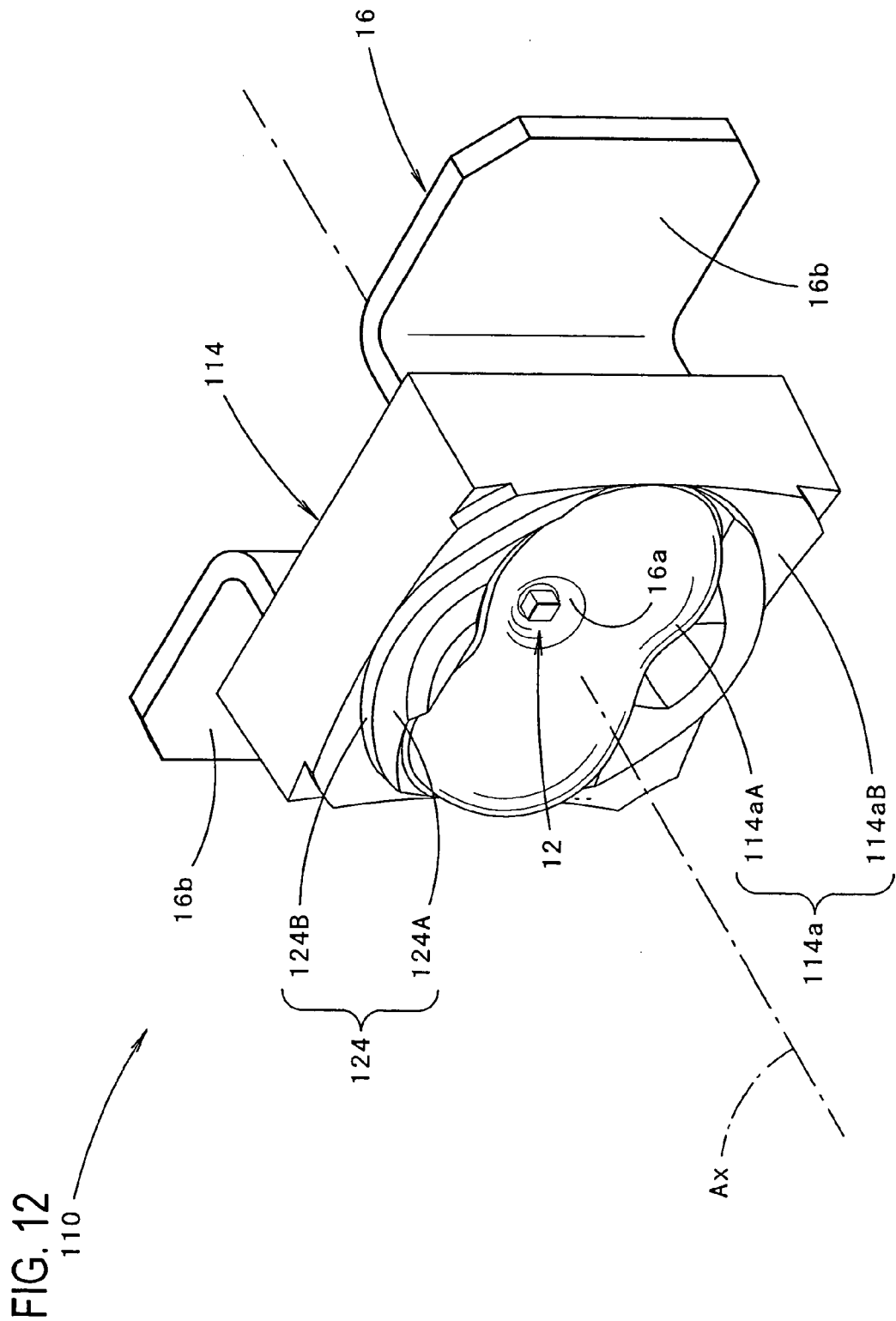

LIGHT-EMITTING DIODE AND VEHICULAR LAMP

BACKGROUND OF THE INVENTION

1. Field of the Invention

The present invention relates to a light-emitting diode in which a light-emitting chip is sealed by a transparent sealing member and to a vehicular lamp and more particularly to a structure of the sealing member of a light-emitting diode and to a vehicular lamp that uses such a light-emitting diode.

2. Description of the Related Art

In recent years, light-emitting diodes are used more often in vehicular lamps as its light source.

Light-emitting diodes are generally comprised of, as disclosed in Japanese Patent Application Laid-Open (Kokai) No. 2001-283616, a light-emitting chip, which is disposed on a predetermined optical axis, and a transparent sealing member, which seals the front side of the light-emitting chip on the optical axis. The front face of the sealing member has a substantially spherical surface.

Japanese Patent Application Laid-Open (Kokai) No. 2002-94129 discloses a light-emitting diode in which the rear face is a reflective surface so that the light emitted from the light-emitting chip is used more efficiently.

The feature of the above-described conventional light-emitting diodes is that the luminance of the emitted light rapidly decreases according to the increase in the divergence angle from the optical axis, which is manifested in the form of a luminance distribution. This, however, causes problems that such a light-emitting diode cannot radiate light with sufficient luminance in an oblique direction while the light-emitting diode radiates light with sufficient luminance in the forward direction.

When such light-emitting diodes as described above are used as a light source of a vehicular lamp, several problems occur.

Most of vehicular lamps have a mechanism that controls the light emitted from the light source by a lens disposed in front of the light source so as to create a light distribution pattern that exhibits balanced luminance distribution. However, when a light-emitting diode is used as a light source, such a lens arrangement cannot sufficiently mitigate the sharp luminance distribution of the light-emitting diode. As a result, such a lamp radiates light with an extremely great intensity to the front of the lamp (which is so-called pinpoint illumination), and this problem cannot be solved.

In addition, for most of the vehicular lamps, there is a need to make the size of the lens of a lamp as large as possible in order to secure a sufficient light-emitting area. In this case, the light emitted from the light-emitting diode reaches the perimeter of the lens at a significantly wide incident angle, and this reduces the lens efficiency. As a result, a further problem occurs that the light directed from the perimeter of the lens is significantly low in intensity as compared to the light directed from the center portion of the lens.

BRIEF SUMMARY OF THE INVENTION

Accordingly, it is an object of the present invention to provide a vehicular light-emitting diode that has no such problems as seen in the conventional light-emitting diodes in which the luminance rapidly decreases according to the increase in the divergence angle centered on the optical axis.

It is another object of the present invention to provide a vehicular lamp that uses such a light-emitting diode as its light source.

The present invention accomplishes the above-described objects with a sealing member that has an improved surface structure.

More specifically, the above objects are accomplished by a unique structure of the present invention for a light-emitting diode that includes a light-emitting chip disposed on a predetermined optical axis, and a transparent sealing member for sealing the light-emitting chip on the side that faces the forward direction along the optical axis; and in the present invention, the front face of the sealing member has a curved surface portion; and the cross-sectional shape of the curved surface portion taken along a first plane that includes the optical axis is formed in the shape of an undulating curve that has a concave curve positioned near the optical axis and convex curves positioned on both sides of the concave curve.

Though the above-described "front face of the sealing member" can be formed by the above-described "curved surface portion" alone, it is possible to form the "front face of the sealing member" by a combination of such a "curved surface portion" and other components.

The shape of the curve that forms the cross-sectional shape of the above-described "curved surface portion" taken along the plane orthogonal to the first plane is not particularly restricted as long as the cross-sectional shape of the "curved surface portion" taken along the first plane is formed by the above-described undulating curve. Also, the outer shape of the "curved surface portion" is not particularly restricted in the present invention.

The above-described "first plane" is not particularly restricted to a plane at a particular position as long as the "first plane" includes the optical axis.

The specific range for the above-described "concave curve" is not particularly restricted as long as the "concave curve" is positioned so that it includes the optical axis. Also, the specific shape and curvature of the "concave curve" are not particularly restricted.

The specific range for each of the above-described "concave curves" is not particularly restricted as long as the "convex curves" are positioned on both sides of the "concave curve". Also, the specific shape and curvature of each of the "convex curves" are not particularly restricted. In addition, each of the "convex curves" may be or may not be configured so that it is connected (or is continuous) to the "concave" curve smoothly. Furthermore, the "convex curves" may be or may not be formed in the same shape.

As seen from the above, in the structure of the present invention described above, the light-emitting diode of the present invention has a light-emitting chip disposed on a predetermined optical axis and a transparent sealing member that seals the light-emitting chip on the side that faces the forward direction along the optical axis; and further, sealing member has a curved surface portion on the front face. In addition, the cross-sectional shape of the curved surface portion taken along the first plane that includes the optical axis is formed by an undulating curve that has a concave curve positioned near the optical axis and convex curves positioned on both sides of the concave curve. This structure provides several advantages.

In other word, of the light emitted from the light-emitting chip in the first plane, the light directed in a direction that has a small divergence angle centered on the optical axis reaches the portion of the concave curve of the curved surface portion of the sealing member. Accordingly, such light is directed forward as diffused light deflected from the optical axis by the light diffusion capability of the concave curve of the curved surface portion of the sealing member. On the other hand, of the light emitted from the light-emitting chip in the first plane, the light directed in a direction that has a large divergence angle centered on the optical axis reaches the portion of the convex curves. Accordingly, such light is directed forward as light deflected to a direction that has a predetermined divergence angle centered on the optical axis by the light convergence capability of the convex curves of the curved surface portion of the sealing member. As a result, in the first plane, the luminance distribution of the light directed from the curved surface portion of the sealing member gradually increases in the luminance or to be substantially uniform for the range from a direction along the optical axis up to a direction that has a predetermined divergence angle centered on the optical axis.

Accordingly, the light-emitting diode of the present invention has no such problem that the luminance distribution in which the luminance reduces according to the increase in the divergence angle centered on the optical axis as seen in the conventional light-emitting diodes.

In the present invention, the curved surface portion of the sealing member can be formed in a shape created by rotating the undulating curve about the optical axis. This structure provides a luminance distribution of the light directed from the curved surface portion of the sealing member which exhibits a smooth increase in the luminance or exhibits a substantially uniform luminance distribution, from the direction along the optical axis up to the direction that has a predetermined divergence angle centered on the optical axis in any direction toward any portion of the perimeter with respect to the optical axis. As a result, even in a case that a large-size lens is provided in front of the light-emitting diode, it is possible to have the lens appear to be sufficiently illuminated up to the perimeter edge portions.

Alternatively, instead of the above-described arrangement, the cross-sectional shape of the curved surface portion of the sealing member taken along a second plane, which is parallel to the optical axis and is orthogonal to the first plane, can be in the shape of a convex curve. This structure provides a luminance distribution that exhibits high luminance within a predetermined angle range of a small divergence angle centered on the optical axis in the second plane while exhibiting a smooth increase in the luminance or exhibiting a substantially uniform luminance distribution, from the direction along the optical axis up to the direction that has a predetermined divergence angle centered on the optical axis in the first plane. As a result, even in a case that a narrow (laterally lengthy) lens is provided in front of the light-emitting diode, it is possible to have the lens appear to be sufficiently illuminated up to the perimeter near each of both edges of the lens.

In the structure described above, the outer shape of the curved surface portion of the sealing member is not particularly restricted. Nonetheless, the outer shape can be formed in a bilobal shape that has a transversely narrowed part in the middle in the longitudinal direction of the bilobal shape when viewed from the front (i.e., when viewed from the front along the optical axis). In this arrangement, of the light emitted from the light-emitting chip in the first plane, the incident light amount directed to the curved surface portion at a large divergence angle centered on the optical axis can be maintained at substantially the same level as the incident light amount of the light directed to the curved surface portion at a small divergence angle centered on the optical axis.

In the present invention, the perimeter of the curved surface portion of the front face of the sealing member can be formed with a deflection directing portion, which directs the light emitted from the light-emitting chip so that it is deflected toward the optical axis. This structure improves the utilization efficiency for the light emitted from the light-emitting chip.

In particular, in a case that the cross-sectional shape of the curved surface portion of the sealing member taken along the second plane is in a shape of a convex curve, a relatively large amount of light emitted from the light-emitting chip is directed toward either side of the convex curve, and this structure is markedly advantageous. In a case that the curved surface portion of the sealing member is formed in a bilobal shape that has a transversely narrowed part in the middle in the longitudinal direction of the bilobal shape when viewed from the front, a considerable amount of light emitted from the light-emitting chip is directed toward either side of the middle portion in the longitudinal direction, and this structure is also markedly advantageous.

The specific configuration of the above-described "deflection directing portion" is not particularly restricted in the present invention.

Though the above-described sealing member is a single unit member, it is also possible to form the sealing member with a sealing member main body, which is for sealing the light-emitting chip, and a cover member, which is attached to the sealing member main body on the side that faces the forward direction along the optical direction. In this structure, the light distribution property of the sealing member can be altered by using cover members of different shapes on a standard sealing member main body. The specific method for attaching the cover member(s) to the sealing member main body is not particularly restricted. Examples of such methods for attaching include coupling engagement, press fitting, adhesion, etc.

The usage of the light-emitting diode of the present invention is not particularly restricted. When the light-emitting diode is installed in a vehicular lamp, the vehicular lamp appears to be illuminated with substantially uniform luminance for its entirety at the time of turning on of the vehicular lamp and is easily recognized by other drivers, pedestrians, etc.

BRIEF DESCRIPTION OF THE SEVERAL VIEWS OF THE DRAWINGS

FIGS. 6A and 6B are diagrams showing the luminance distribution of the light-emitting chip on a horizontal plane that includes the optical axis, wherein FIG. 6A shows a luminance distribution of the light emitted by the light-emitting chip, and FIG. 6B shows a luminance distribution of the light directed from the curved surface portion of a sealing member;

FIGS. 11A and 11B are diagrams showing, in the same way as in FIG. 10B, the functions of the first embodiment;

FIG. 12 is a perspective view of the light-emitting diode according to the second embodiment of the present invention;

DETAILED DESCRIPTION OF THE INVENTION

Hereinafter, embodiments of the present invention will be described with reference to the accompanying drawings.

The first embodiment of the present invention will be described first.

Figure 1:
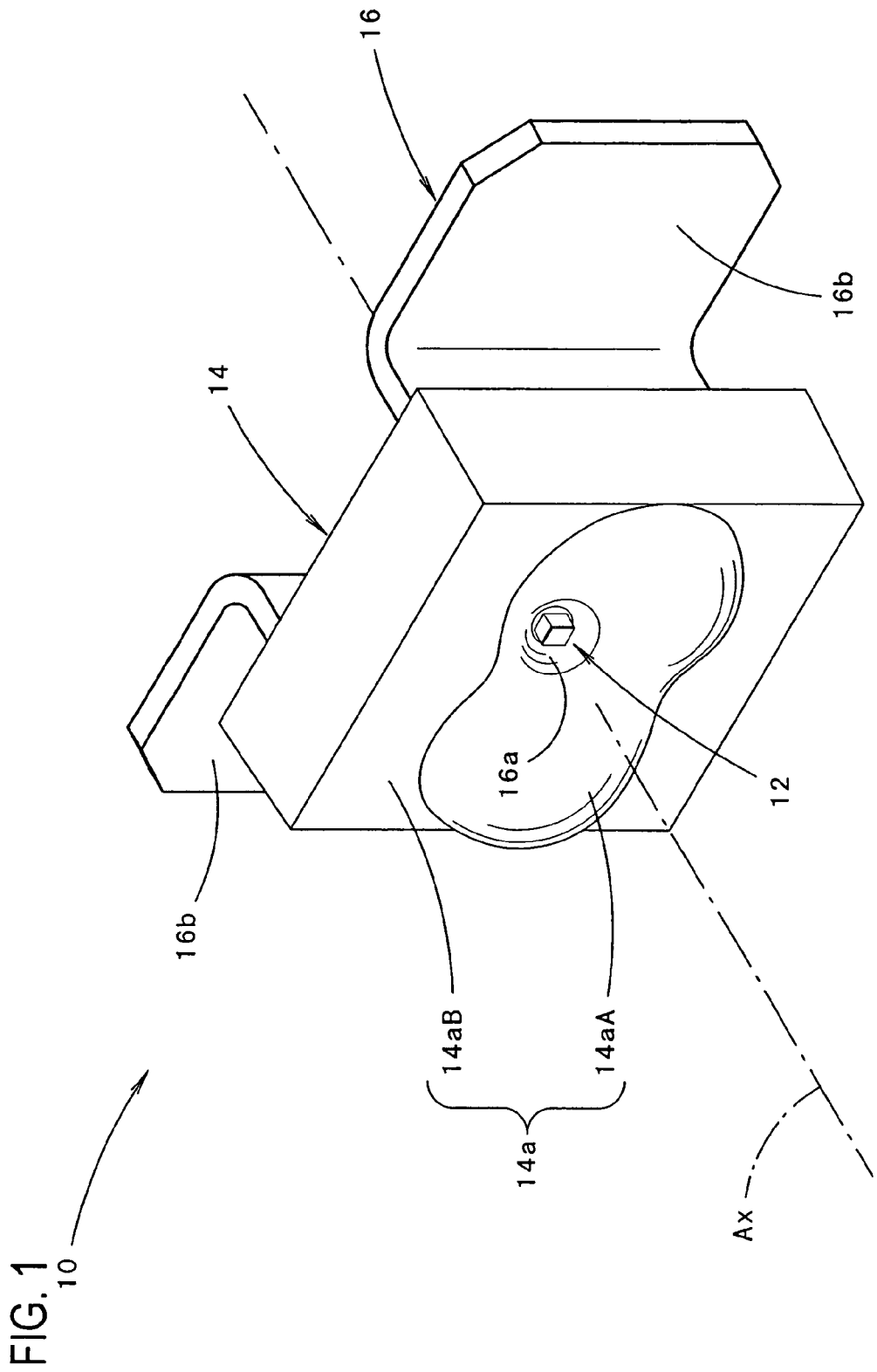
FIG. 1 is a perspective view of the light-emitting diode according to the first embodiment of the present invention.
Figure 2:
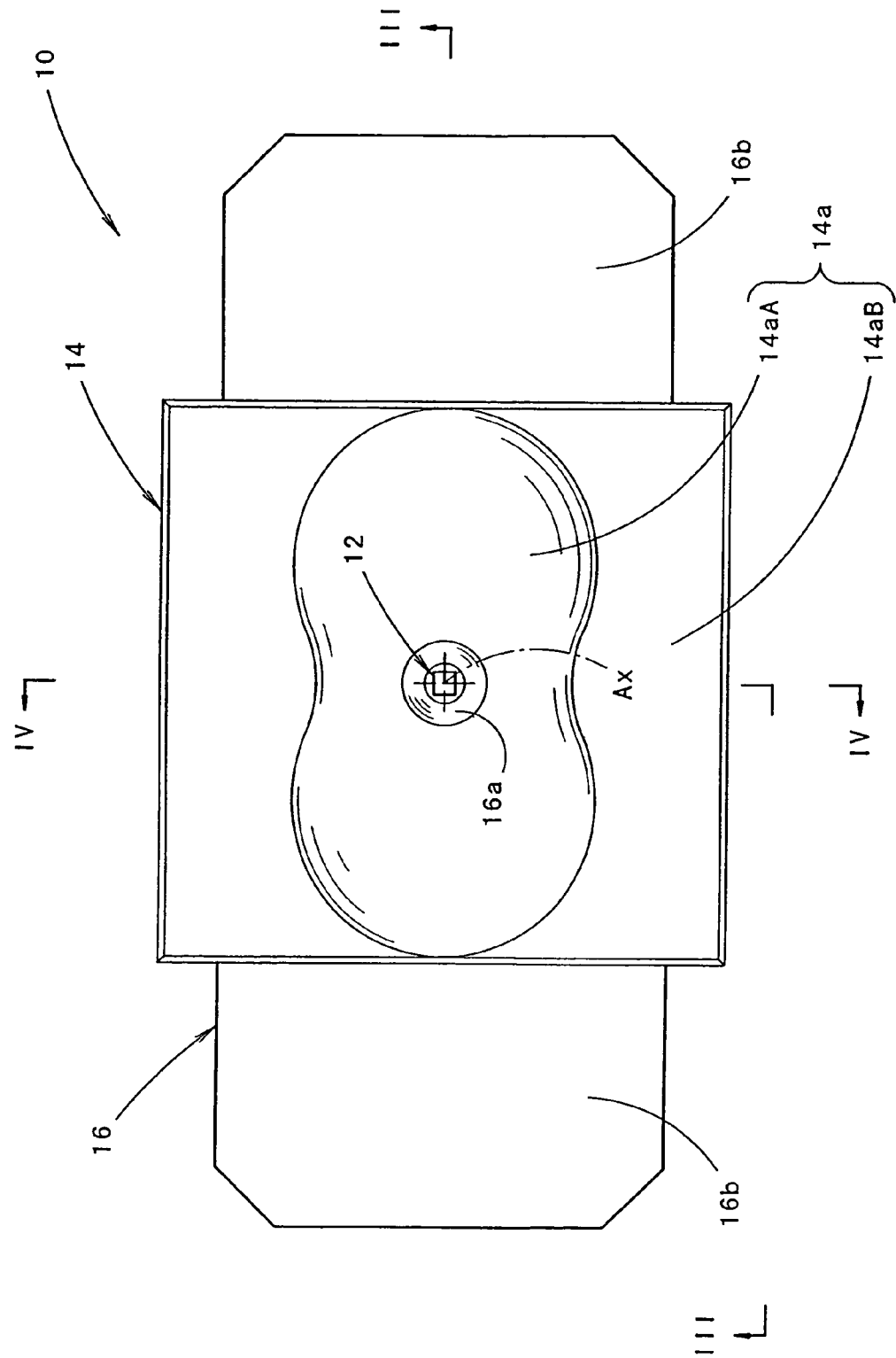
FIG. 2 is a front view thereof.
Figure 3:
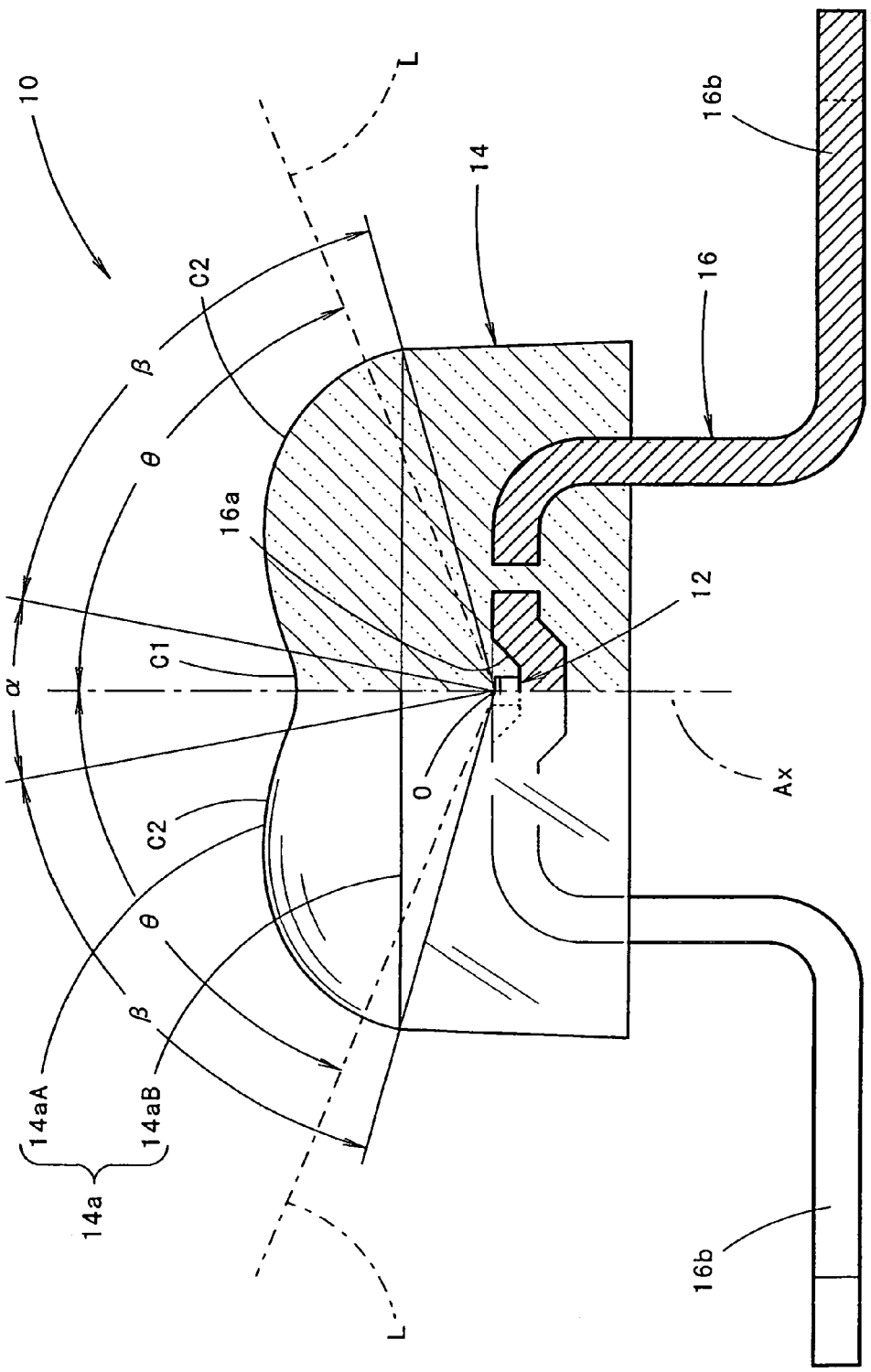
FIG. 3 is a cross-sectional view taken along the line III-III in FIG. 1.
Figure 4:
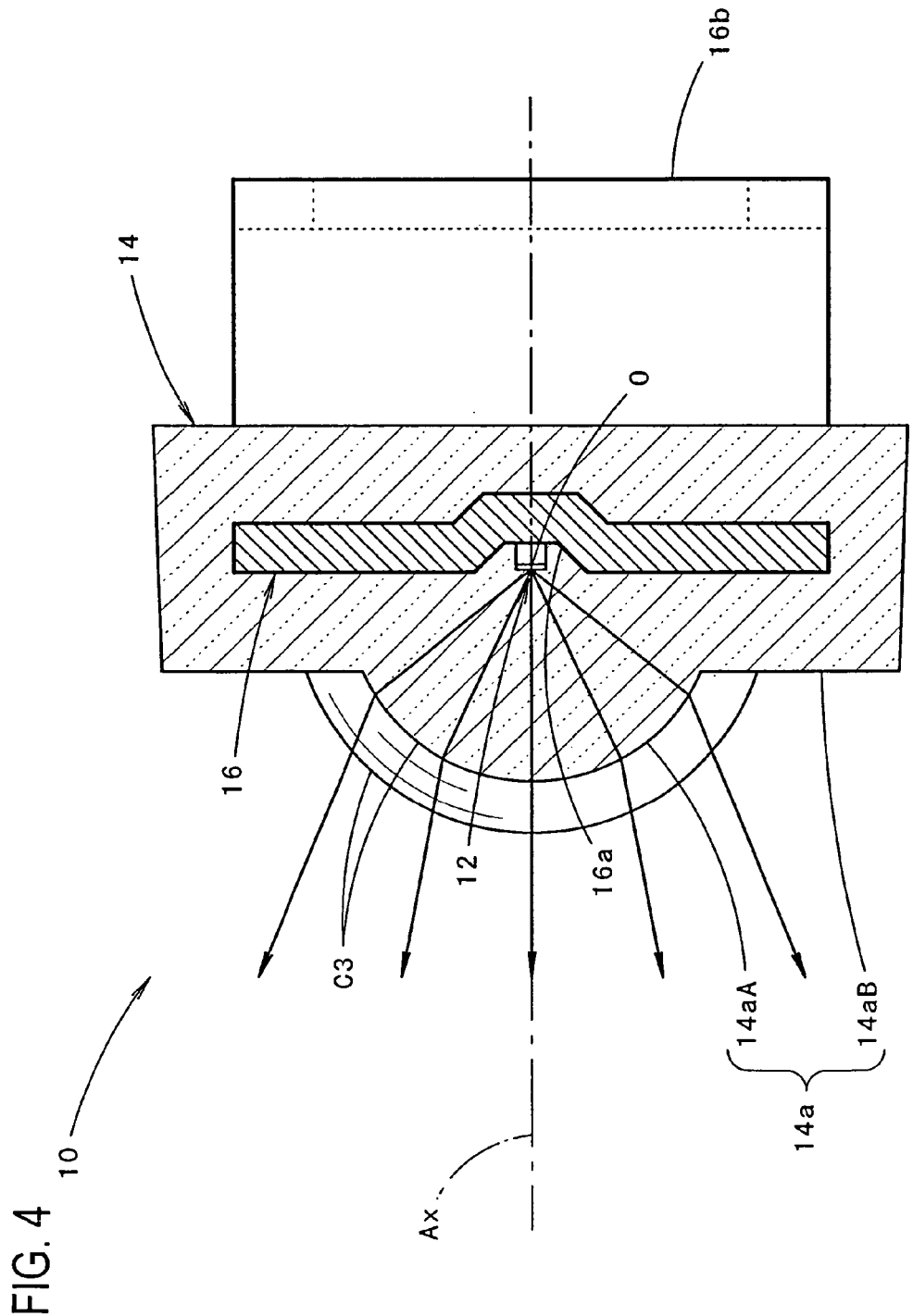
FIG. 4 is a cross-sectional view taken along the line IV-IV in FIG 1.

FIG. 1 is a perspective view of the light-emitting diode 10 according to the first embodiment, and FIG. 2 is a front view thereof. FIG. 3 and FIG. 4 are the cross-sectional views taken along the line III-III and line IV-IV in FIG. 2, respectively.

As seen from FIGS. 1 through 4, the light-emitting diode 10 is comprised of a light-emitting chip 12 disposed on a predetermined optical axis Ax, a transparent sealing member 14 that seals the light-emitting chip 12 on the side that faces the forward direction along the optical axis Ax (which will simply be referred to as "front side" hereafter), and a lead frame 16 for supporting the light-emitting chip 12.

The light-emitting chip 12 has a light emitting face of around 0.3 to 1 mm square and is disposed with its light emission center O positioned on the optical axis Ax and with its light emitting face facing toward the front face (i.e., in the forward direction along the optical axis Ax).

The sealing member 14 is made of a transparent resin such as epoxy resin or the like and is formed square in its outer shape when viewed from the front. The depth of the sealing member 14 is about half the length of one side of its square shape. The sealing member 14 seals the light-emitting chip 12 and a part of the lead frame 16, so that the sealing member 14 wraps around the rear face of the light-emitting chip 12.

The front face 14a of the sealing member 14 has a flat surface portion 14aB, which is formed along the vertical plane orthogonal to the optical axis Ax, and a curved surface portion 14aA, which is formed in a shape of two humps that protrude forward from the flat surface portion 14aB.

As shown in FIG. 3, the cross-sectional shape of the curved surface portion 14aA taken along the horizontal plane that includes the optical axis Ax is formed by an undulating curve that has a concave curve C1 positioned near the optical axis Ax and convex curves C2 on both left and right sides of the concave curve C1.

The shape of this undulating curve is bilaterally symmetrical with respect to the optical axis Ax. The concave curve C1 is formed over the range of a central angle in an angle range of around 15 to 25° (e.g., around 20°) with the light emission center O of the light-emitting chip 12 as a reference point. Each of the convex curves C2 is formed over the range of the above-described central angle in an angle range of around 60 to 70° (e.g., around 65°).

As seen from FIG. 3, the concave curve C1 is formed in a shape of an arc having a relatively large curvature. On the other hand, each of the convex curves C2 is formed with a gradually changing curvature. More specifically, each of the convex curves C2 is formed so that it has the same curvature as the curvature of the concave curve C1 at positions where the concave curve C1 is coupled with the convex curves C2, thus allowing the concave curve C1 and each of the convex curves C2 to be connected with one another. Furthermore, each of the convex curves C2 is formed with a curvature that gradually decreases according to the increase in the divergence angle centered on the optical axis Ax in the lateral direction. In this arrangement, each of the curves C2 is formed so that its smallest curvature is at a position over the angle θ (direction denoted by the line L of alternating long and short dashes in FIG 3) which is somewhat smaller than the far edge divergence angle (i.e., α/2+β). Furthermore, the arc of each of the curves C2 has a constant curvature at the above-described divergence angle or more. The divergence angle θ is set to be around 65 to 75° (e.g., around 70°).

On the other hand, as seen from FIG. 4, the cross-sectional shape of the curved surface portion 14aA taken along the vertical plane, which is parallel to the optical axis Ax, is formed by a convex curve C3. The convex curve C3 is formed by an arc, which has its minimum radius on the optical axis Ax, and the radius of the convex curve C3 then gradually increases as the distance from the optical axis Ax in the lateral direction increases. The radius of the convex curve C3 then gradually decreases pursuant to the further increase in the distance from the optical axis Ax in the lateral direction. The center of the arc that forms the convex curve C3 is positioned somewhat forward with respect to the light emission center O of the light-emitting chip 12.

Since the horizontal cross-sectional shape and the vertical cross-sectional shape of the curved surface portion 14aA take curves as described above, the curved surface portion 14aA has a horizontally bilobal outer shape that has a transversely narrowed part at the middle portion in the longitudinal direction of the bilobal outer shape when viewed from the front.

The lead frame 16 has, as seen from FIG. 3, a shape that it is formed by bending a belt-shaped metal plate into an inverted letter-U shape and then by further bending both ends at right angles so that they extend in the directions opposite to one another. The light-emitting chip 12 is provided at the center of the upper level portion (or of the bottom of the U) of the lead frame 16. A cone-shaped recess 16a is formed at the center of the upper level portion of the lead frame 16, and the light-emitting chip 12 is provided in the center of the bottom of the recess 16a. As best seen from FIG. 5, the lead frame 16 is comprised of left and right separated parts, which are separated in the upper level portion. The light-emitting chip 12 is mounted on one of these separated parts (which is the left side part in FIG. 5), and bonding wires (not shown) extending from the light-emitting chip 12 are connected to the other part (which is the right side part in FIG. 5). While the upper level portion of the lead frame 16 and the light-emitting chip 12 are sealed by the sealing member 14 as described above, a part of each of the pair of left and right terminals 16b of the lead frame 16 extends out of the sealing member 14.

Figure 5:
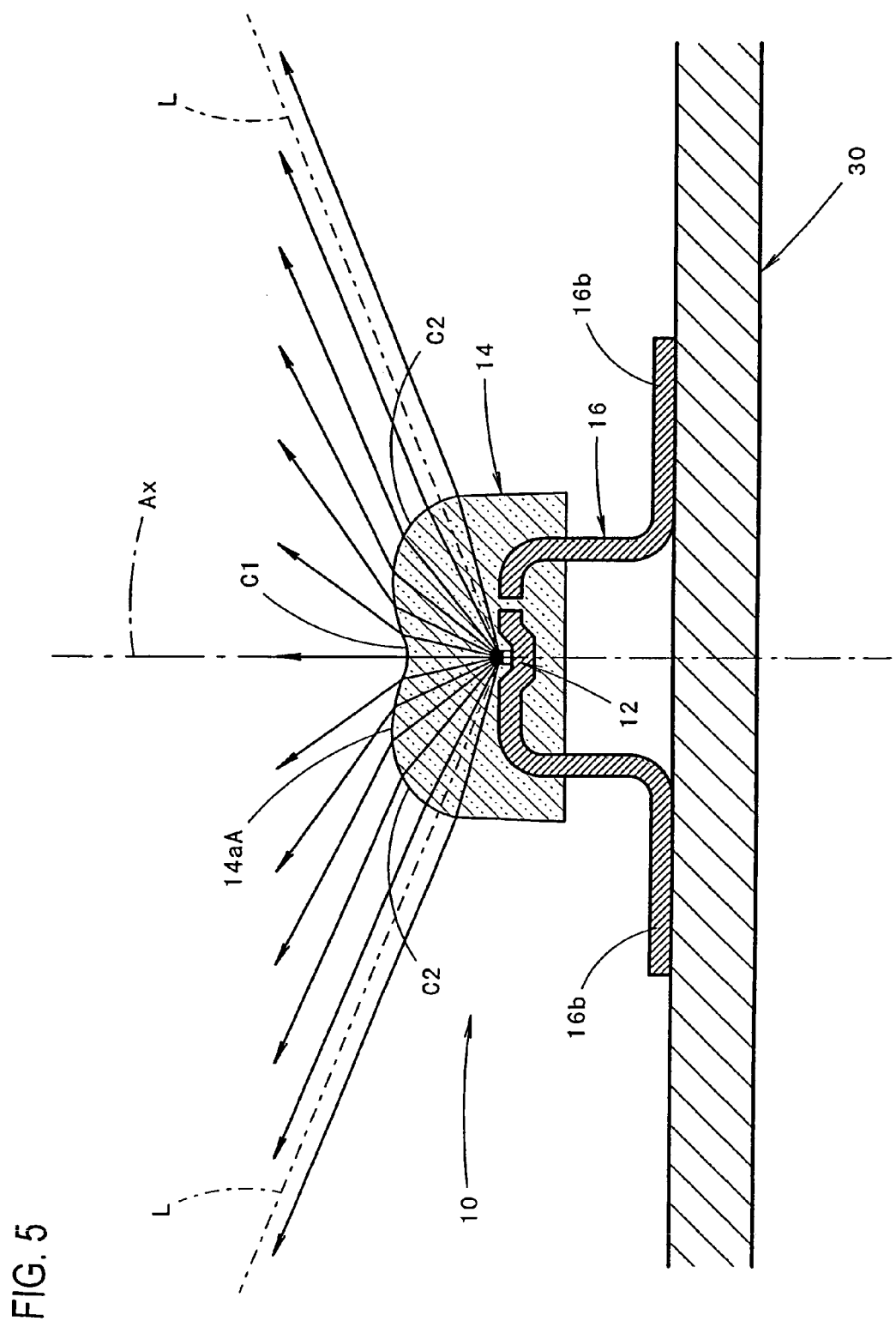
FIG. 5 is a plane (horizontal) cross-sectional view of the light-emitting diode provided on a support board according to the first embodiment.

As shown as a plane (horizontal) cross-sectional view in FIG. 5, the light-emitting element 10 is provided, at both terminals 16b of the lead frame 16, on the support board 30.

Next, the advantages of the first embodiment will be described.

As shown in FIG. 5, a part of the light emitted by the light-emitting chip 12, which has been emitted at a small divergence angle centered on the optical axis Ax in the lateral direction in a horizontal plane that includes the optical axis Ax, reaches the area of the concave curve C1 of the curved surface portion 14aA. Accordingly, such light is directed forward and diffused so that it is distanced from the optical axis Ax by the light-diffusing function of the concave curve C1 of the curved surface portion 14aA. On the other hand, a part of the light emitted by the light-emitting chip 12, which has been emitted at a wide divergence angle centered on the optical axis Ax in the lateral direction, reaches the areas of the convex curves C2 of the curved surface portion 14aA. Accordingly, such light is directed forward so that it is deflected toward lines L positioned at the divergence angle $\theta$ with respect to the optical axis Ax by the light convergence function of the convex curves C2 of the curved surface portion 14aA.

FIGS. 6A and 6B show the luminance distributions of the light-emitting chip 12 within the horizontal plane that includes the optical axis Ax. In particular, FIG. 6A shows a luminance distribution of the light emitted from the light-emitting chip 12. FIG. 6B shows a luminance distribution of the light directed from the curved surface portion 14aA of the sealing member 14 after the emission from the light-emitting chip 12.

As seen from FIG. 6A, the luminance distribution of the light emitted from the light-emitting chip 12 exhibits the maximum luminance on the optical axis Ax extending in the forward direction. Furthermore, it is a characteristic of this luminance distribution that the luminance rapidly decreases according to the increase in the divergence angle centered on the optical axis Ax. This is because the light-emitting chip 12 is disposed so that the light-emitting face faces forward.

On the other hand, as seen from FIG. 6B, the luminance distribution of the light directed from the curved surface portion 14aA of the sealing member 14 has a shape that is similar to a suspension bridge. In other words, it is a characteristic of this luminance distribution that the maximum luminance value appears in the direction over a divergence angle, which is somewhat smaller than the divergence angle $\theta$, centered on the optical axis Ax in the lateral direction. Furthermore, in this luminance distribution, the luminance decreases according to the reduction in the divergence angle from the above-described divergence angle and exhibits its minimum value on the optical axis Ax. On the other hand, the luminance rapidly decreases according to the increase in the divergence angle beyond the divergence angle $\theta$. This is because the cross-sectional shape of the curved surface portion 14aA, which is taken along the horizontal plane that includes the optical axis Ax, includes the undulating curve formed by the concave curve C1 positioned near the optical axis Ax and the convex curves C2 positioned on the left and right sides of the concave curve C1.

As seen from the above, the light-emitting diode 10 of the first embodiment of the present invention has no such a problem of conventional light-emitting diodes in which a rapid reduction in luminance occurs as the divergence angle with respect to the optical axis increases.

Furthermore, in the above-described light-emitting element 10, the cross-sectional shape of the curved surface portion 14aA of the sealing member 14 taken along the vertical plane that is parallel to the optical axis Ax has the convex curve C3. Accordingly, the luminance distribution of light emitted by the light-emitting chip 12 and directed from the curved surface portion 14aA of the sealing member 14 takes a luminance distribution that is created by concentrating the luminance distribution of the light, which has been emitted by the light-emitting chip 12, within a predetermined angle range of a small divergence angle centered on the optical axis in the vertical direction.

Furthermore, in the light-emitting diode 10 of the first embodiment, the concave curve C1 and each of the convex curves C2 positioned on the left and right sides of the concave curve C1 (the concave curve C1 and the convex curves C2 forming the cross-sectional shape of the curved surface portion 14aA of the sealing member 14 taken along the horizontal plane that includes the optical axis Ax) are connected (or in continuous) smoothly with one another. Accordingly, the luminance distribution of the light that is directed from the curved surface portion 14aA of the sealing member 14 changes smoothly.

Figure 7:
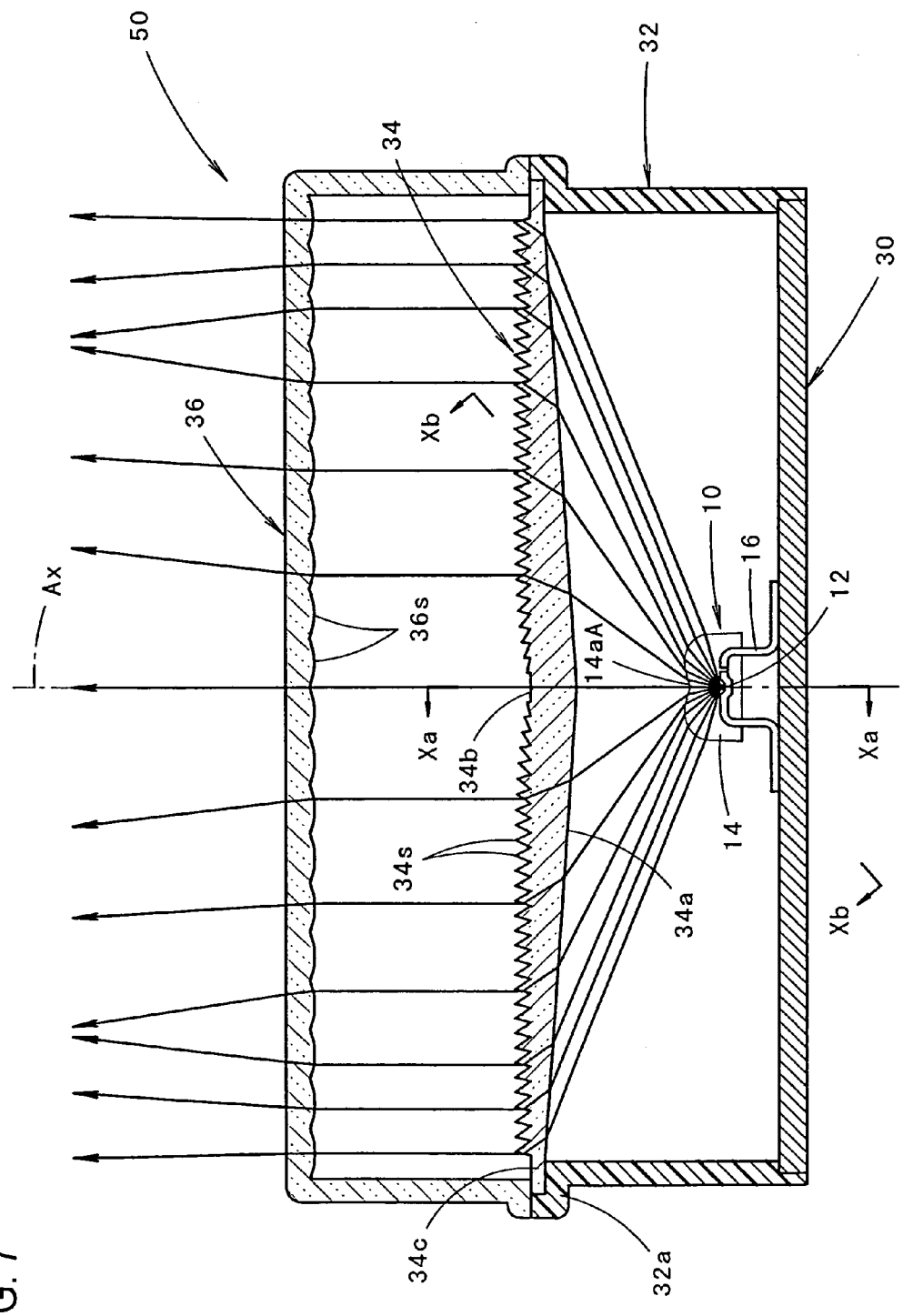
FIG. 7 is a plane (horizontal) cross-sectional view of a vehicular lamp that includes the light-emitting diode according to the first embodiment which is used as the light source.
Figure 8:
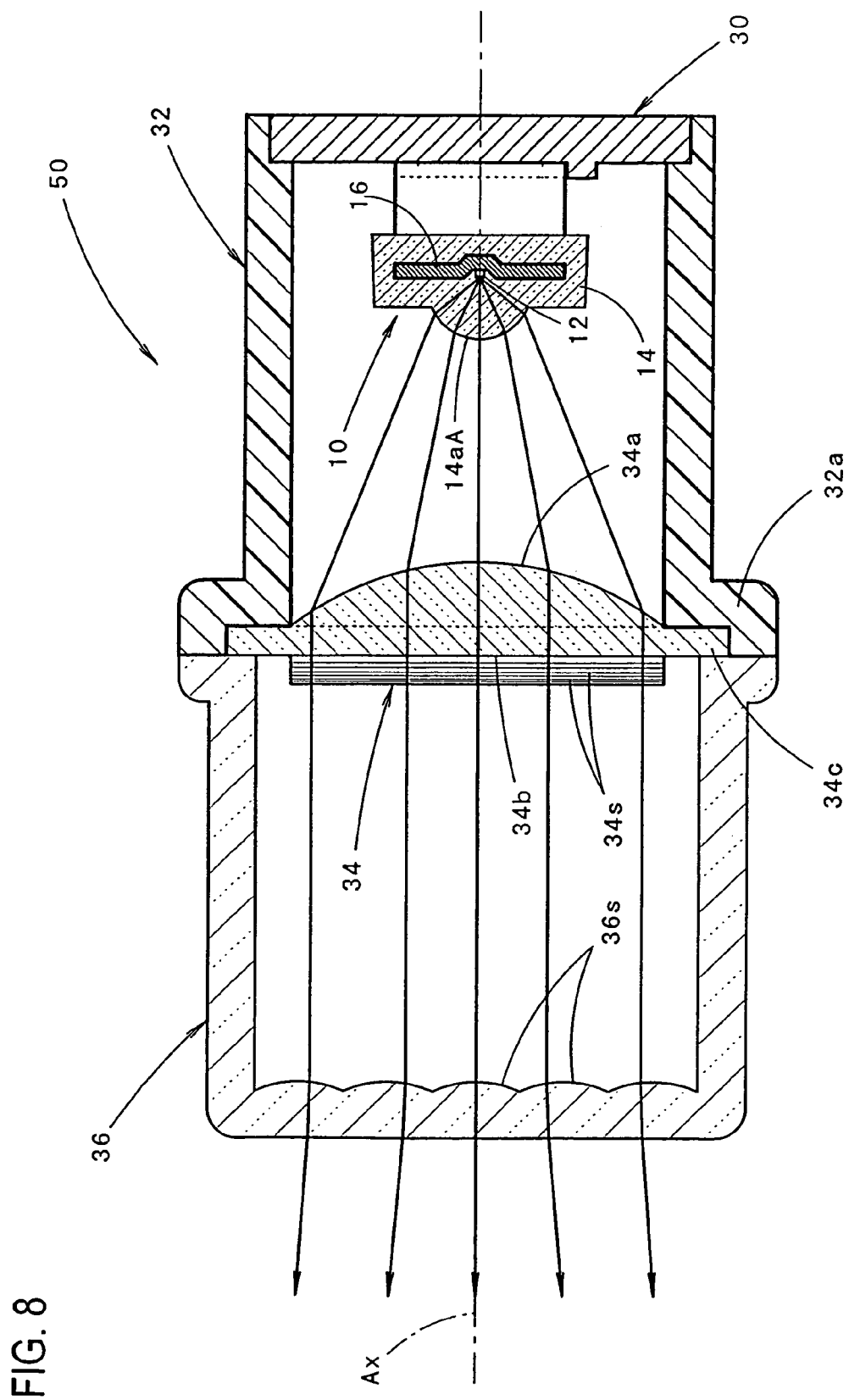
FIG. 8 is a side (vertical) cross-sectional view of the vehicular lamp of FIG. 7.

FIG. 7 and FIG. 8 show, in plane (horizontal) cross-section and in side (vertical) cross-section, respectively, the vehicular lamp 50 that is installed with the light-emitting diode 10 of the first embodiment as its light source.

As seen from FIGS. 7 and 8, the vehicular lamp 50 includes: a polygonal lamp body 32 for fixing the support board 30, which supports and fixes the light-emitting diode 10, at its perimeter portion; an inner lens 34, which is fixed at a front end opening 32a of the lamp body 32; and an outer lens 36, which is fixed to the lamp body 32 with the inner lens 34 pressed in contact with the front end opening 32a of the lamp body 32.

The vehicular lamp 50 has an outer shape of a horizontally long rectangle with a smaller vertical width (height) when viewed from the front. More specifically, the horizontal width of the vehicular lamp 50 is set to be a value around four times greater than the vertical width (height). Thus, the support board 30, the inner lens 34 and the outer lens 36 are formed accordingly in the shape of a horizontally long rectangle. The lamp body 32 is in the shape of a polygon that has a rectangular cross-sectional shape along the vertical plane orthogonal to the optical axis Ax.

Figure 9:
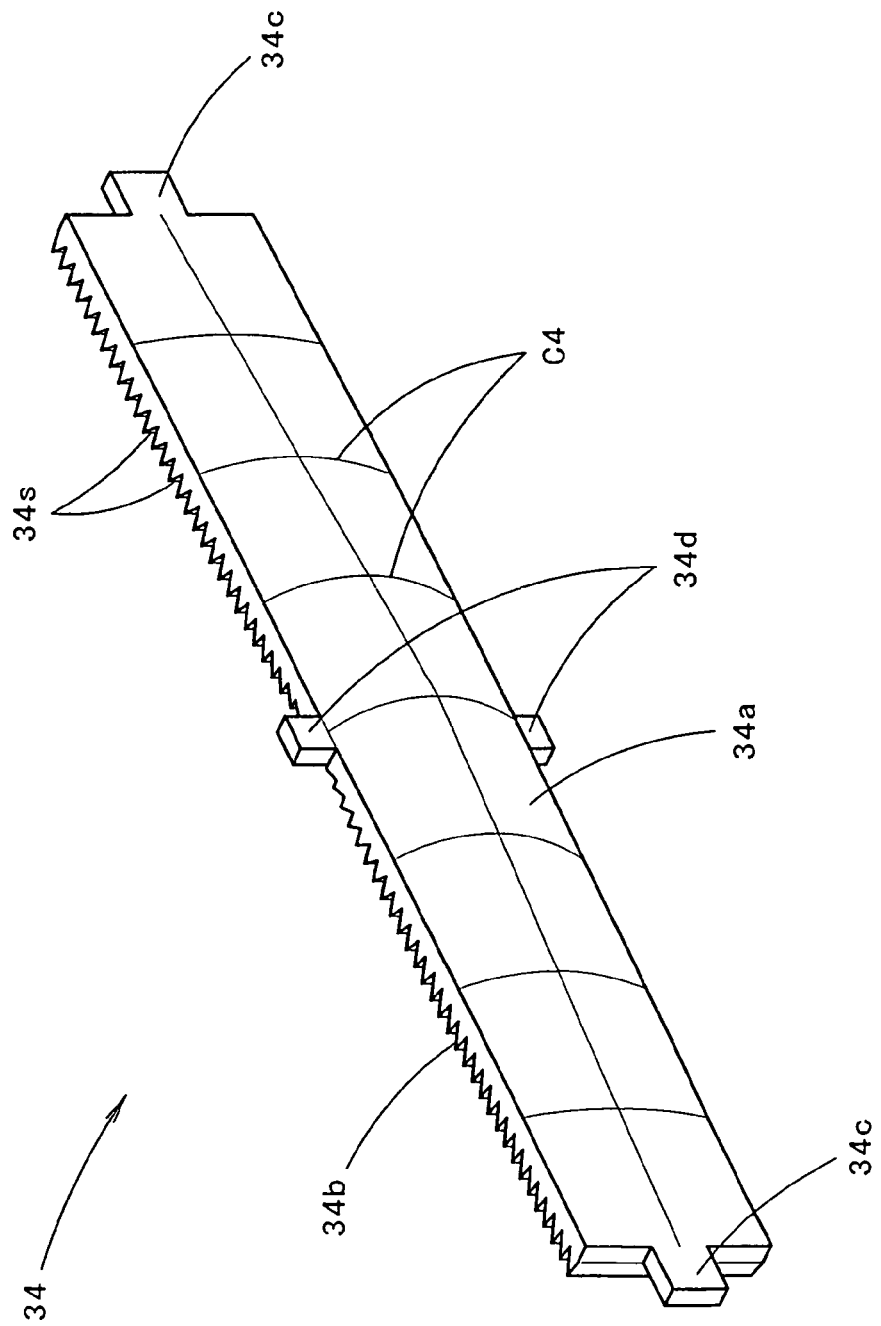
FIG. 9 is a perspective view of the inner lens of the first embodiment.

The rear face 34a of the inner lens 34 has, as seen from FIG. 9, a cylindrical surface that extends in its lateral direction. The convex curve C4, which forms the cross-sectional shape taken along each vertical plane parallel to the optical axis Ax, is formed by an arc having a predetermined curvature that gradually reduces according to the increase in the distance from the optical axis Ax in the lateral direction. Furthermore, the cross-sectional shape of the cylindrical face taken along the horizontal plane takes a gentle V-shape that gradually extends forward according to the increase in the distance from the optical axis Ax in the lateral direction.

Furthermore, the inner lens 34 has multiple prism-shaped lens elements 34s formed on the front face 34b in a shape of a stripe-shaped array having a sawtooth-shaped cross-sectional shape. The lens elements 34s cause the light incident on the inner lens 34 from the light-emitting element 10 to be deflected and directed in a direction closer to the optical axis Ax with respect to the lateral direction.

The inner lens 34 has a pair of lateral tabs 34c on the left and right sides of the outer edge and a pair of longitudinal tabs 34d on its upper and lower edges. The inner lens 34 is fixed to the lamp body 32 with the tabs 34c and 34d aligned with the front end opening 32a of the lamp body 32.

The inner lens 34 causes light emitted from the light-emitting element 10 to be directed forward parallel to the optical axis Ax. A detailed configuration thereof will be described later.

As shown in FIG. 7 and FIG. 8, the outer lens 36 has multiple fisheye-lens-shaped diffusion lens elements 36s formed on the inner face. The diffusion lens elements 36s direct the light, which has been incident on the outer lens 36 from the inner lens 34 in the form of parallel light fluxes, forward from the outer lens 36 so that it is diffused in the vertical direction and the horizontal direction.

Figure 10A:
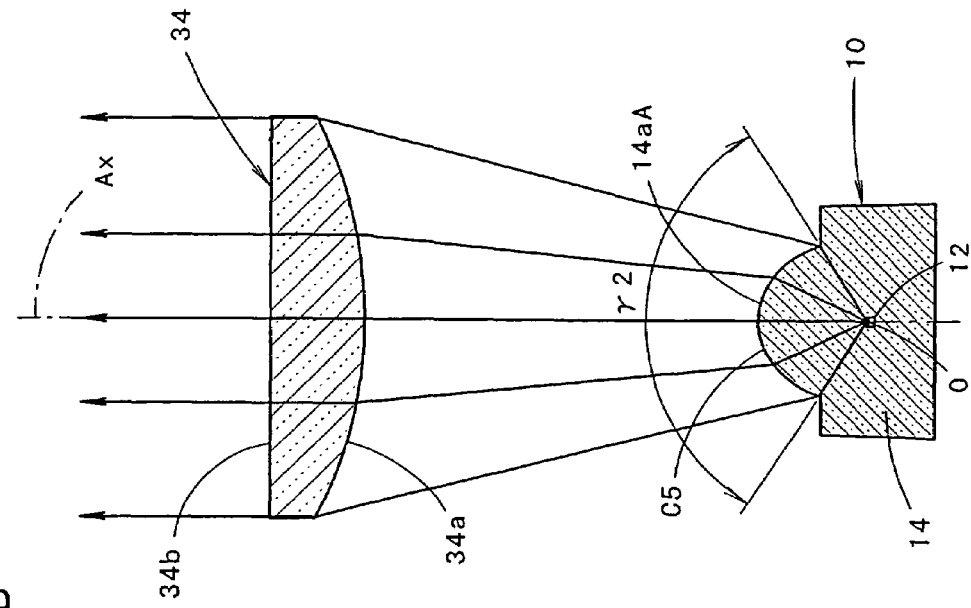
FIG. 10A is a cross-sectional view taken along the line Xa-Xa in FIG. 7.
Figure 10B:
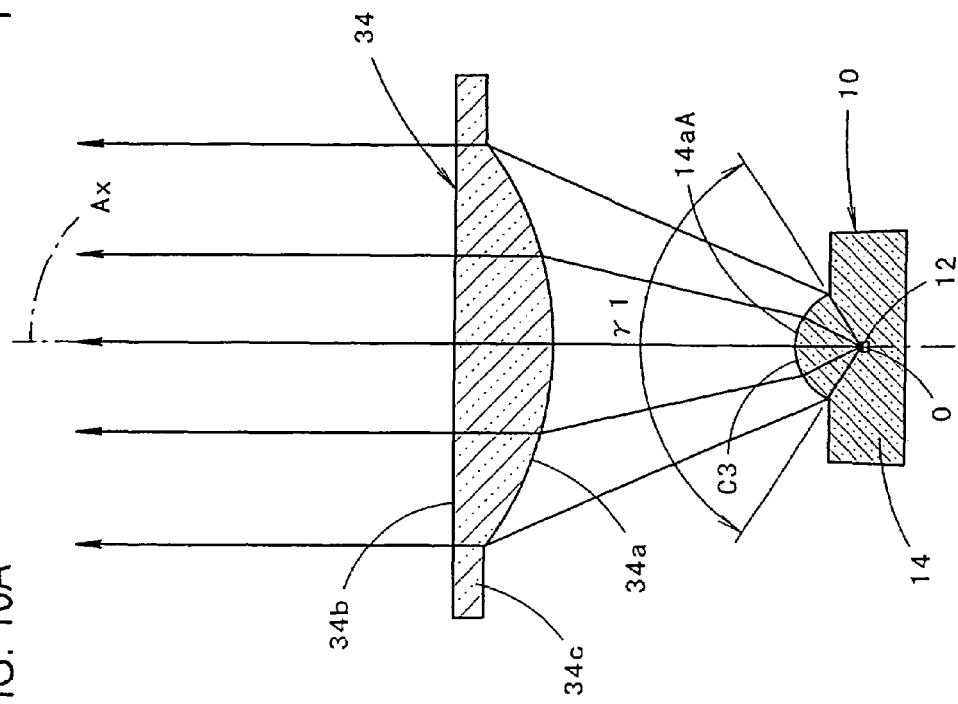
FIG. 10B is a cross-sectional view taken along the line Xb-Xb in FIG. 7.

FIG. 10A is a cross-section taken along the line Xa-Xa in FIG. 7, and FIG. 10B is a cross-section taken along the line Xb-Xb in FIG. 7.

As seen from FIG. 10A, in the vertical plane that includes the optical axis Ax, the light, which has been emitted by the light-emitting chip 12 in the direction within the range of the angle γ1 centered on the optical axis Ax, is directed forward from the curved surface portion 14aA of the sealing member 14. On the other hand, as seen from FIG. 10B, in the vertical plane, which passes through the light emission center O of the light-emitting chip 12 and inclines in the lateral direction with respect to the optical axis Ax, the light, which has been emitted by the light-emitting chip 12 in the direction within the range of the angle γ2 centered on the optical axis Ax, is directed forward from the curved surface portion 14aA of the sealing member 14. The curved surface portion 14aA is formed in the shape of two humps so as to have the bilobal outer shape whose longer axis is horizontal and that has a transversely narrowed part in the middle in the longitudinal direction of the bilobal outer shape when viewed from the front. Accordingly, the angles γ1 and γ2 are set to be substantially the same value.

On the other hand, in the vertical plane shown in FIG. 10B, the convex curve C5, which forms the vertical cross-sectional shape of the curved surface portion 14aA of the sealing member 14, matches the shape obtained not only by simply enlarging the convex curve C3, which forms the vertical cross-sectional shape of the curved surface portion 14aA in the vertical plane shown in FIG. 10A, but also by slightly extending the convex curve C3 in the front-back direction. As a result, the refracting power is high with respect to the light emitted from the light-emitting chip 12. Accordingly, although the distance from the light-emitting diode 10 to the inner lens 34 in the vertical plane shown in FIG. 10B is greater than that in the vertical plane shown in FIG. 10A, such light emitted from the light-emitting diode 10 can reach the inner lens 34 without any loss.

FIG. 11A shows a cross-section taken along the line Xb-Xb in FIG. 7 in the same way as in FIG. 10B, and it is a diagram for describing the effects of the outer shape of the curved surface portion 14aA of the sealing member 14 having a horizontally bilobal shape that has a transversely narrowed part in the middle in the longitudinal direction of the bilobal shape when viewed from the front.

If it is assumed that the curved surface portion 14aA of the sealing member 14 have an outer shape of a horizontally bilobal shape that extends in the lateral direction with a uniform width in the vertical cross-section which is the same as that in the vertical plane shown in FIG. 10A, then only the light emitted from the light-emitting chip 12 in the direction within the angle range of γ2' (γ2'<γ2) would reach the curved surface portion 14aA' indicated by the line of alternating one long and two short dashes, resulting in that the luminous flux utilization factor with respect to the light emitted from the light-emitting chip 12 is reduced. However, in the shown embodiment, the curved surface portion 14aA of the sealing member 14 is formed so that the outer shape is a horizontally bilobal shape that has a transversely narrowed part in the middle in the longitudinal direction of the bilobal outer shape. Accordingly, the luminous flux utilization factor with respect to the light emitted from the light-emitting chip 12 improves.

FIG. 11B shows a cross-section taken along the line Xb-Xb in FIG. 7 in the same way as in FIG. 10B, and it is a diagram describing the effects of the convex curve C4, which forms the cross-sectional shape of the cylindrical face forming the rear face 34a of the inner lens 34 taken along a vertical plane parallel to the optical axis Ax, with a predetermined curvature that gradually reduces according to the increase in the distance from the optical axis Ax in the lateral direction.

If it is assumed that the above-described convex curve C4 be formed with a uniform curvature as indicated by the line of alternating one long and two short dashes in FIG. 11B, then the cross-sectional shape of the rear face 34a' of the inner lens 34 taken along the vertical plane would match the convex curve that has an increased curvature as if it is created by extending the convex curve C4 in the front-back direction, causing the refracting power to be excessive in the rear face 34a' of the inner lens 34. Accordingly, the light cannot be directed from the inner lens 34 parallel to the optical axis Ax. However, in the shown embodiment, the convex curve C4 is formed with the curvature that gradually reduces according to the increase in the distance from the optical axis Ax in the lateral direction. Accordingly, the light to be directed from the inner lens 34 is parallel to the optical axis Ax regardless of where the light is incident on the inner lens 34.

As can be understood from the above, the entire region of the inner lens 34 appears to be illuminated at a substantially uniform luminance when the vehicular lamp 50 is observed from a position in front of the lamp in a state in which the light-emitting diode 10 is turned on without the outer lens 36. Accordingly, in a state that the outer lens 36 is added to, the entire region of the outer lens 36 appears to be illuminated at a substantially uniform luminance when the vehicular lamp 50 is observed not only from a position just in front of the lamp but also from a side position which is deviated somewhat obliquely from the front position in either the vertical or horizontal direction.

Furthermore, with regard to the inner lens 34, the cylindrical face, which forms the rear face 34a, is formed in a V-shaped cross-sectional shape taken along the horizontal plane, which gradually extends forward according to the increase in the distance from the optical axis Ax in the lateral direction. Accordingly, the light emitted from the light-emitting diode 10 is greatly refracted in the direction closer to the optical axis Ax by the rear face 34a of the inner lens 34, allowing the light to be directed from the inner lens 34 in parallel to the optical axis Ax, thus improving the light directing efficiency of the multiple prism-shaped lens elements 34s formed on the front face 34b.

Though in the above-described vehicular lamp 50 the parallel light is diffused in the vertical direction and the lateral direction by the outer lens 36 after the light emitted from the light-emitting element 10 is adjusted so as to be parallel light fluxes, other arrangements are possible so that the front face of the inner lens 34 has such a diffusion function as described above while the outer lens 36 has a plain lens function and so that the outer lens 36 is omitted.

Next, the second embodiment according to the present invention will be described.

Figure 13:
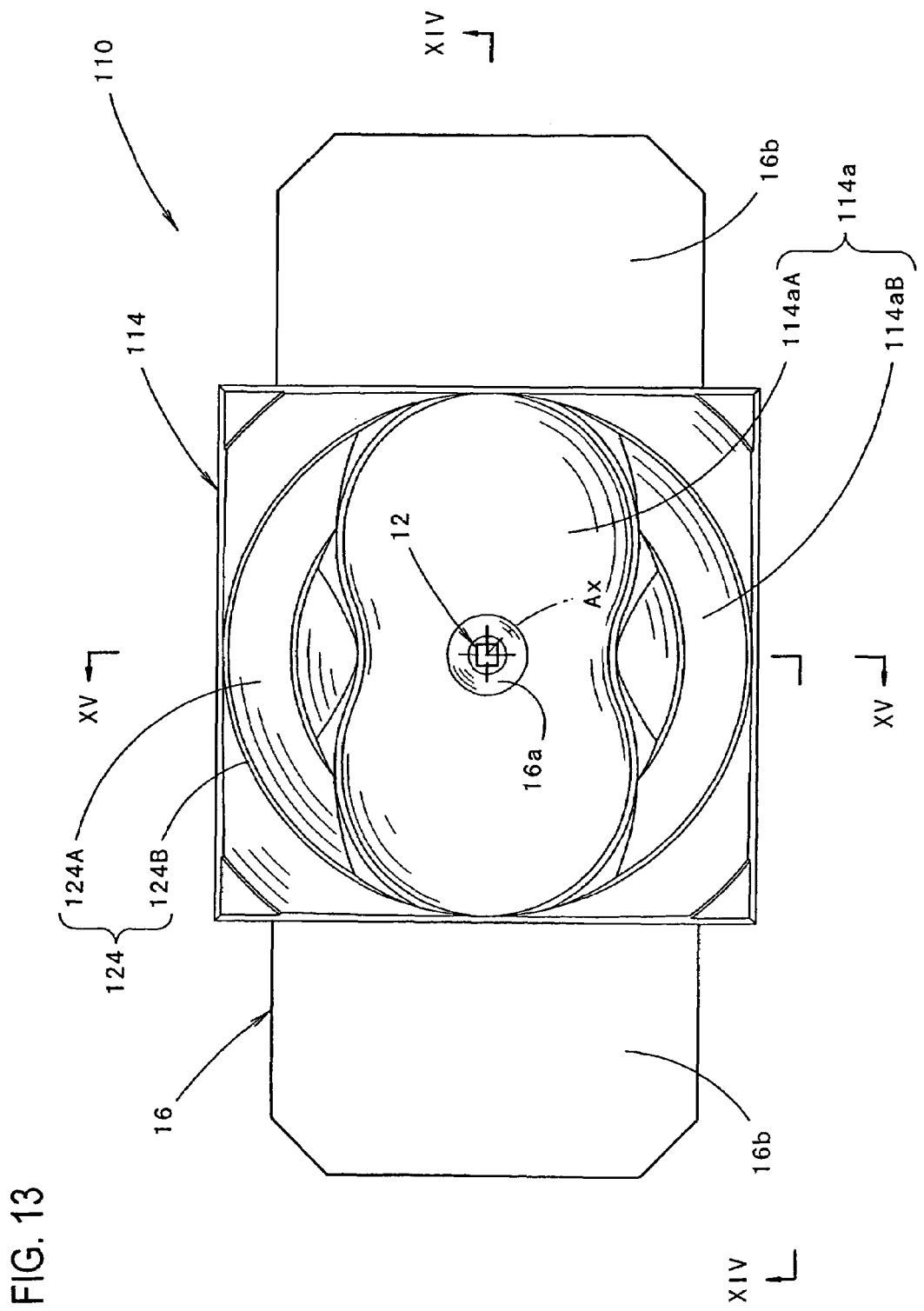
FIG. 13 is a front view of the light-emitting diode of the second embodiment of the present invention.
Figure 14:
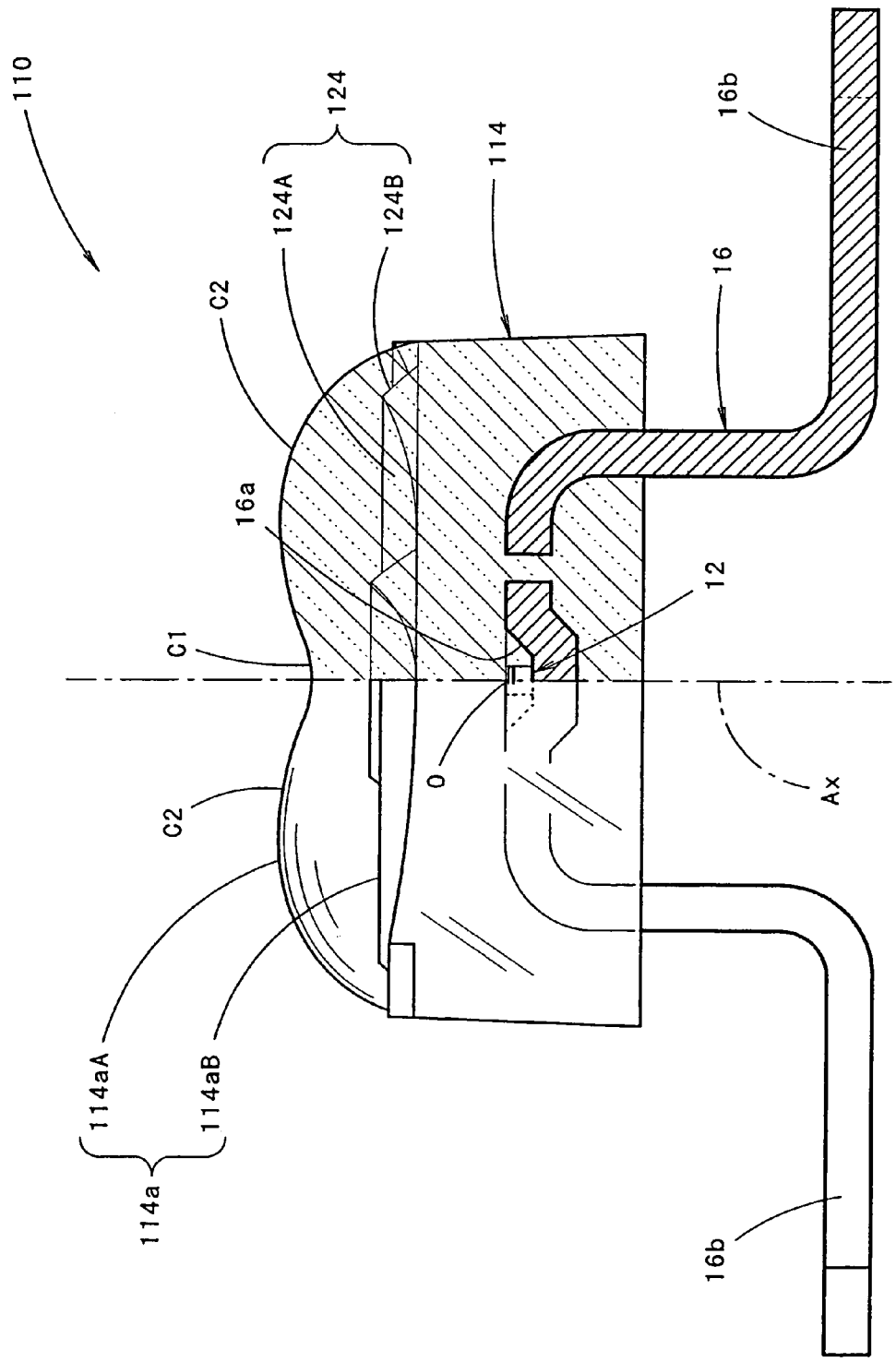
FIG. 14 is a cross-sectional view taken along the line XIV-XIV in FIG. 12.
Figure 15:
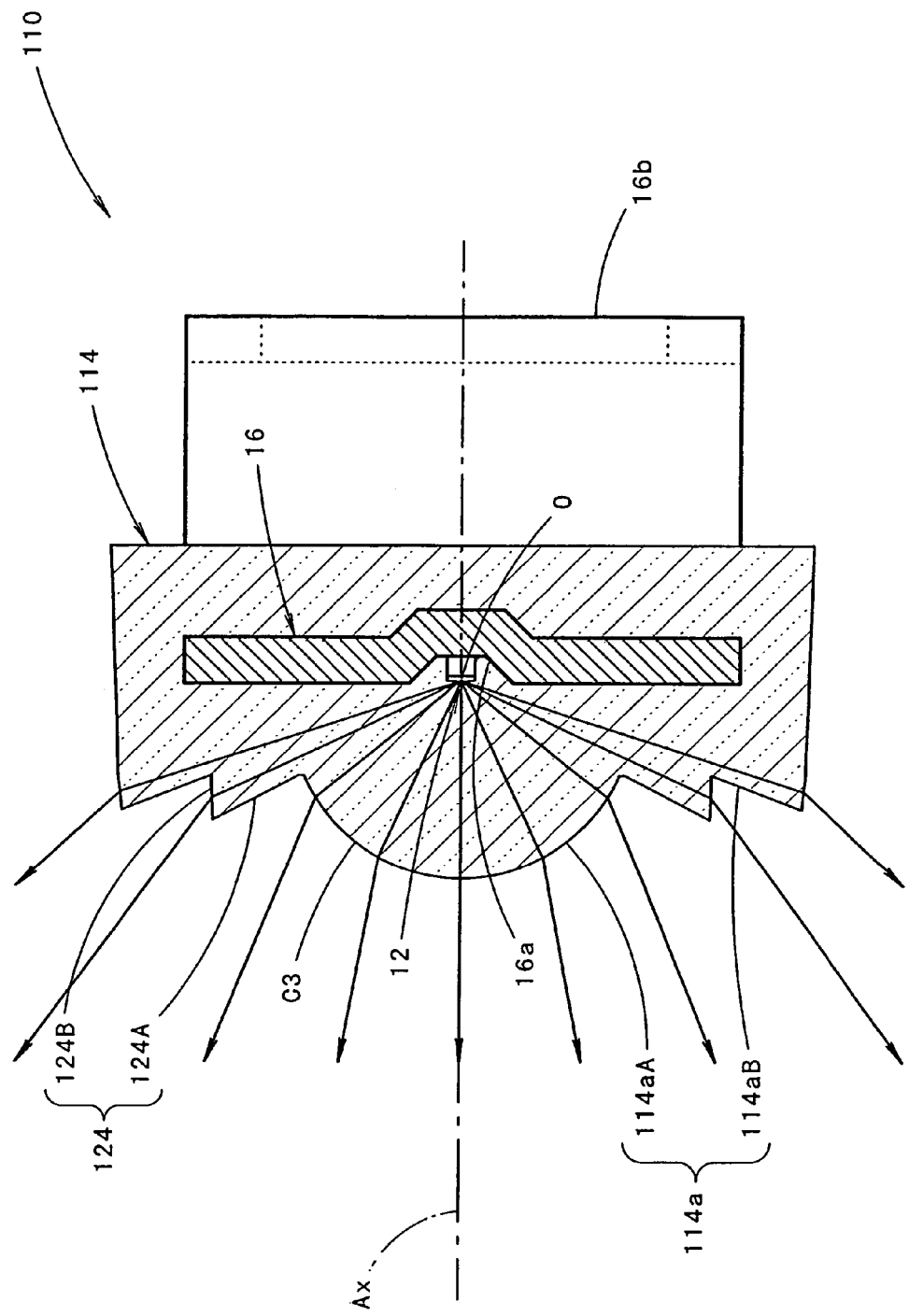
FIG. 15 is a cross-sectional view taken along the line XV-XV in FIG. 12.

FIG. 12 is a perspective view of the light-emitting diode 110 of the second embodiment, and FIG. 13 is a front view thereof. FIG. 14 and FIG. 15 are cross-sectional views taken along the line XIV-XIV and line XV-XV in FIG. 13, respectively.

As seen from FIGS. 12 through 15, the light-emitting diode 110 has the same basic configuration as that of the light-emitting diode 10 of the above-described first embodiment. The configuration of the front face 114*a* of the sealing member 114 of the light-emitting diode 110, however, differs from that of the first embodiment.

In other words, the front face 114*a* of the sealing member 114 is formed by a curved surface portion 114*a*A and a deflection directing portion 114*a*B.

The curved surface portion 114*a*A has entirely the same structure as that of the curved surface portion 14*a*A of the front face 14*a* in the sealing member 14 of the first embodiment.

The deflection directing portion 114*a*B of the sealing member 114 has a shape created by dividing the flat surface portion 14*a*B of the front face 14*a* of the sealing member 14 of the first embodiment in the form of a series of concentric circles, and by protruding these divided parts forward in a stepped manner so as to have a sawtooth-shape in cross-section. Each of the circular stepped portions 124, which form the deflection directing portion 114*a*B, has an inside sloped portion 124A and an outside sloped portion 124B. The inside sloped portion 124A has a conical face which is shifted in the forward direction and toward the outer side in the radial direction with respect to the optical axis Ax. The outside sloped portion 124B has a conical face created by slightly and gradually reducing the diameter of cylindrical face in the forward direction with the optical axis Ax as the center. The deflection directing portion 114*a*B is formed so that the light emitted from the light-emitting chip 12 and reached the deflection directing portion 114*a*B is directed at the outside sloped portion 124B in such a manner that it is deflected toward the optical axis Ax.

The light-emitting diode 110 of the second embodiment has the same advantages as those of the light-emitting diode 10 of the first embodiment, and it further improves the utilization efficiency for the light emitted from the light-emitting chip 12.

In particular, the light-emitting diode 110 of the second embodiment has the curved surface portion 114*a*A in the front face 114*a* of the sealing member 114, and this curved surface portion 114*a*A has an outer shape of horizontally bilobal shape a transversely narrowed part in the middle in the longitudinal direction of the bilobal outer shape when viewed from the front. Accordingly, a considerable amount of light emitted from the light-emitting chip 12 is directed toward the deflection directing portion 114*a*B, and it is markedly advantageous to take the configuration of the second embodiment.

Next, the third embodiment of the present invention will be described below.

Figure 16:
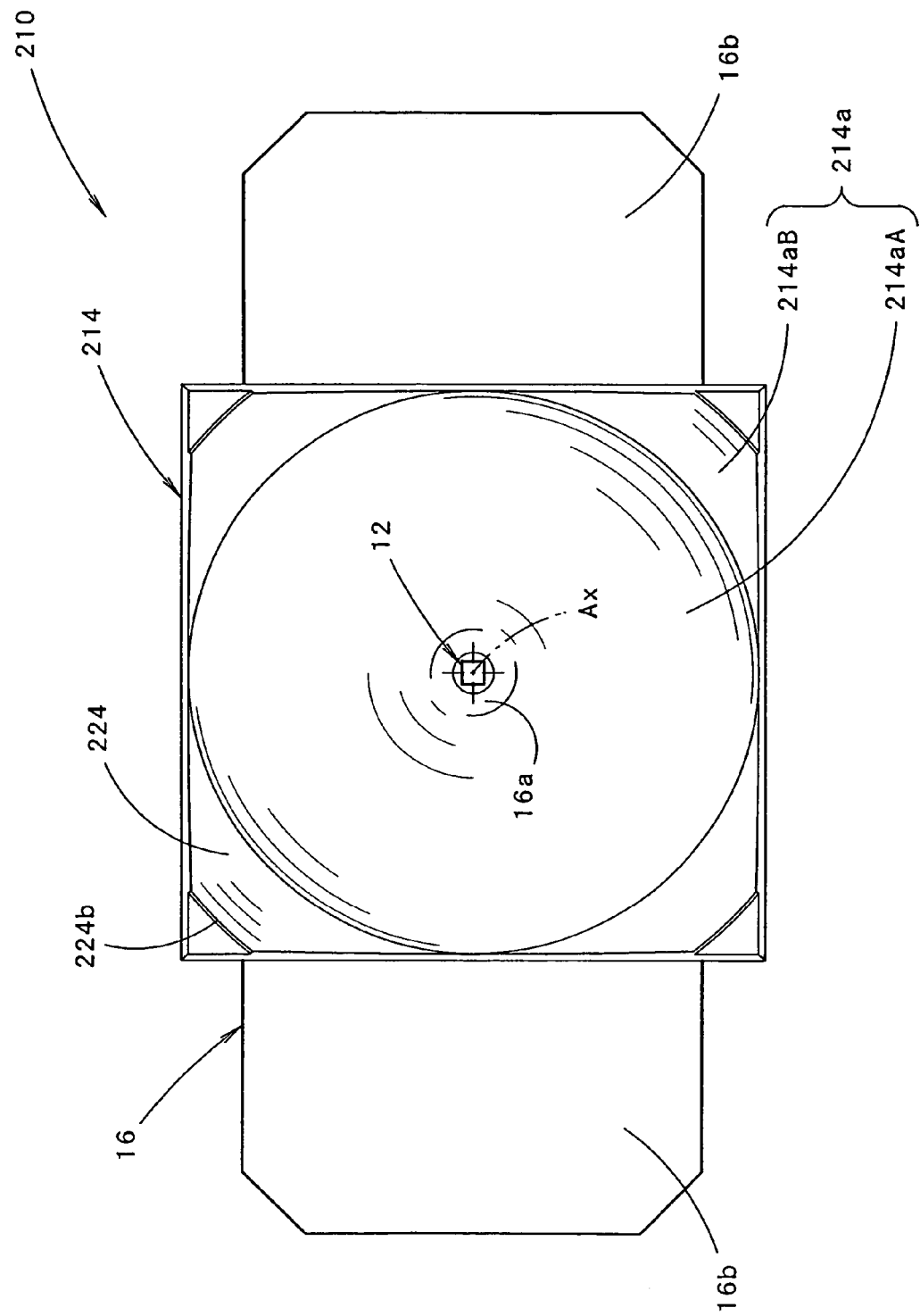
FIG. 16 is a front view of the light-emitting diode according to the third embodiment of the present invention.

FIG. 16 shows a light-emitting diode 210 of the third embodiment.

As seen from FIG. 16, the light-emitting diode 210 has the same basic configuration as that of the light-emitting diode 10 of the first embodiment. The front face 214*a* of the sealing member 214 of the light-emitting diode 210, however, differs from that of the first embodiment.

In other words, the front face 214*a* of the sealing member 214 has a curved surface portion 214*a*A and a deflection directing portion 214*a*B.

The curved surface portion 214*a*A is formed as a surface of revolution, in which the undulating curve, which forms the cross-sectional shape of the curved surface portion 14*a*A of the front face 14*a* of the sealing member 14 taken along the horizontal plane that includes the optical axis Ax of the first embodiment, is rotated about the optical axis Ax.

The deflection directing portion 214*a*B is formed by a circular stepped portion 224 that has entirely the same structure as that of the circular stepped portion 124 at the outermost position, which is one of the multiple circular stepped portions 224 that form the deflection directing portion 114*a*B of the second embodiment. The deflection directing portion 214*a*B is configured so that the light emitted from the light-emitting chip 12 and reached the deflection directing portion 214*a*B is directed at the outside sloped portion 224*b* of the circular stepped portion 224 in such a manner that it is deflected toward the optical axis Ax.

The light-emitting diode 210 of the third embodiment provides a luminance distribution of the light directed from the curved surface portion 214*a*A of the front face 214A of the sealing member 214 characterized by the luminance gradually increasing from the direction along the optical axis Ax to the direction over the predetermined divergence angle centered on the optical axis Ax in any direction toward any part of the perimeter thereof with respect to the optical axis Ax. Thus, even in a case that a large-size lens is provided in front of the light-emitting diode 210, this lens can appear to be sufficiently illuminated up to the perimeter portion.

Furthermore, the structure of the light-emitting diode 210 of the third embodiment improves the utilization efficiency for the light emitted from the light-emitting chip 12.

Next, the fourth embodiment of the present invention will be described below.

Figure 17:
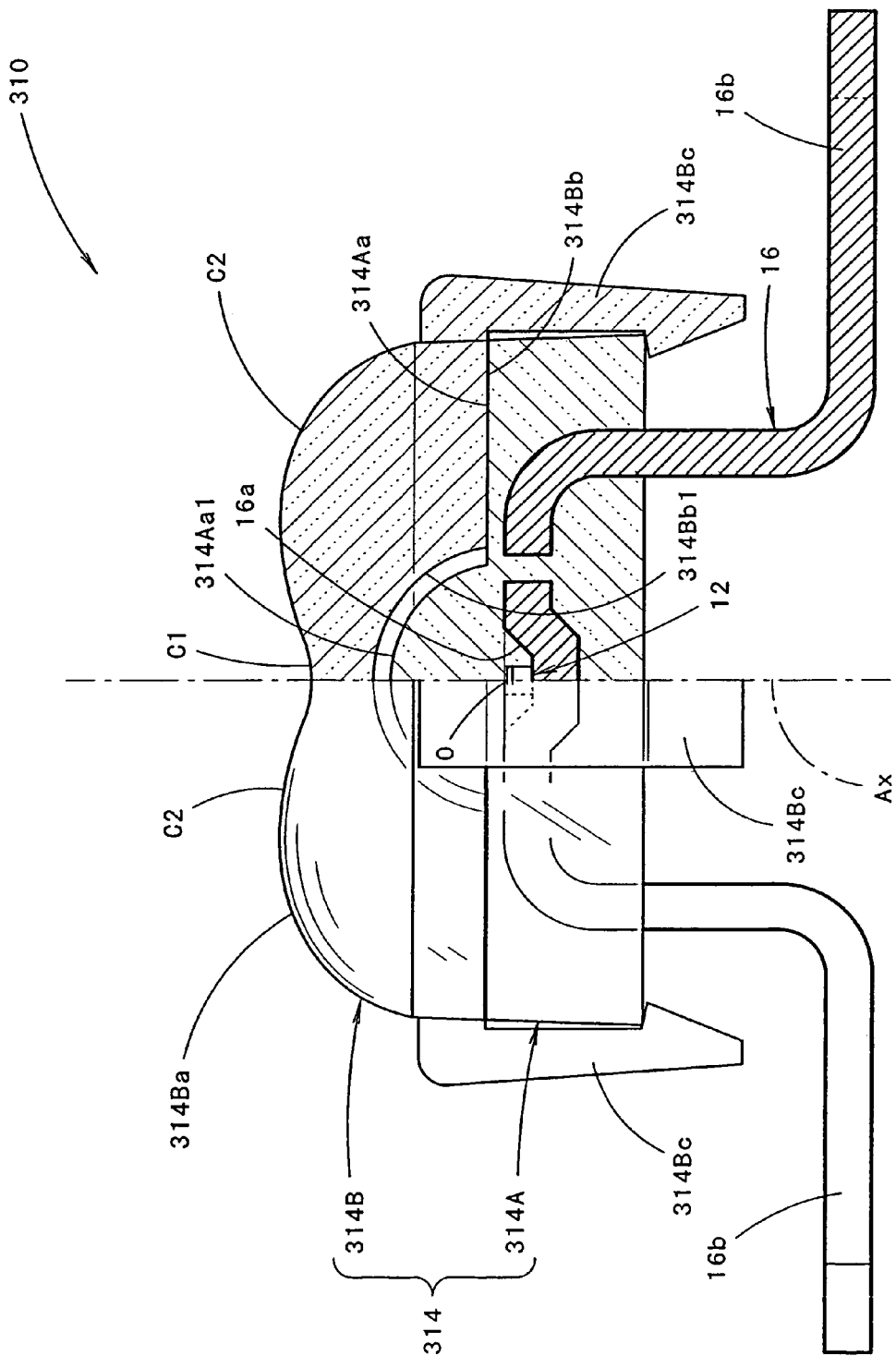
FIG. 17 is a diagram showing, in the same way as in FIG. 3, the light-emitting diode according to the fourth embodiment of the present invention.

FIG. 17 shows a light-emitting diode 310 of the fourth embodiment in the same way as in FIG. 3.

As seen from FIG. 17, the light-emitting diode 310 of the fourth embodiment has the same basic configuration as that of the light-emitting diode 10 of the first embodiment. The configuration of the sealing member 314 of the light-emitting diode 310, however, differs from that of the first embodiment.

More specifically, the sealing member 314 is comprised of a sealing member main body 314A, which is for sealing the light-emitting chip 12, and a cover member 314B, which is attached to the front side of the sealing member main body 314A.

In the sealing member main body 314A, the front face 314A*a* is formed along the plane orthogonal to the optical axis Ax, and it has a dome portion 314A*a*1 formed in the middle portion so that it protrudes forward. The dome portion 314A*a*1 has a spherical face with the light emission center O of the light-emitting chip 12 as the center.

With regard to the cover member 314B, the front face 314B*a* thereof is formed in entirely the same shape as that of the front face 14*a* of the sealing member 14 of the first embodiment. On the other hand, the rear face 314B*b* has a flat face along the vertical plane orthogonal to the optical axis Ax, and it also has a dome recess 314B*b*1 at the middle. The dome recess 314B*b*1 has a spherical face with the light emission center O of the light-emitting chip 12 at the center and with the radius set to be a value somewhat greater than the radius of the dome portion 314Aa1 of the sealing member main body 314A.

Furthermore, the cover member 314B has elastic legs 314Bc, each being formed on the corresponding one of four sides of the perimeter of the cover member 314B such that it extends backward. When the cover member 314B is pressed into contact with the sealing member main body 314A on the side that faces the forward direction, the tip of each elastic leg 314Bc comes in contact with the outer perimeter face of the sealing member main body 314A. When the elastic legs 314Bc are elastically bent, the rear face 314Bb of the cover member 314B comes in contact with the front face 314Aa of the sealing member main body 314A, so that the tip of each elastic leg 314Bc is engaged with the rear face of the sealing member main body 314A.

With the light-emitting diode 310 of the fourth embodiment, it is possible to alter the light distribution property of the sealing member by using cover members 314B of different shapes on the sealing member main body 314A which is used as a standard. For example, a cover member 314B with a front face 314Ba that has the same structure as the front face 14a of the sealing member 14 of the first embodiment, a cover member 314B with a front face 314Ba that is the same structure as that of the front face 114a of the sealing member 114 of the second embodiment, and a cover member 314B with a front face 314Ba that has the same structure as that of the front face 214a of the sealing member 214 of the third embodiment, can be prepared, so that one of them is used with the standard sealing member main body 314A depending upon the use purposes.

Furthermore, in the sealing member 314 of the fourth embodiment, the cover member 314B is attached to the sealing member main body 314A by coupling engagement. Thus, the assembling is facilitated.

In the above descriptions, the light-emitting chip 12 is formed in the shape of a square with the length of each of the four sides around 0.3 to 1 mm. However, other arrangements are indeed possible, and light-emission chips formed in any other shape (e.g., horizontally long rectangle, etc.) and/or any other size can be employed.

The invention claimed is:

1. A light-emitting diode comprising:
    a light-emitting chip disposed on a predetermined optical axis, and
    a transparent sealing member for sealing said light-emitting chip on a side that faces a forward direction along the optical axis;
    wherein
    a front face of said sealing member has a curved surface portion; and
    a cross-sectional shape of the curved surface portion taken along a first plane that includes the optical axis is formed in a shape of an undulating curve that has a concave curve positioned near the optical axis and convex curves positioned on both sides of the concave curve.

2. The light-emitting diode according to claim 1, wherein the curved surface portion is formed in a shape of a surface of revolution created by rotating the undulating curve about the optical axis.

3. The light-emitting diode according to claim 1, wherein the cross-sectional shape of the curved surface portion taken along a second plane, which is parallel to the optical axis and orthogonal to the first plane, is formed in a shape of a convex curve.

4. The light-emitting diode according to claim 3, wherein an outer shape of the curved surface portion is formed in a bilobal shape that has a narrowed part in the middle.

5. The light-emitting diode according to claim 1, wherein the curved surface portion of the front face of said sealing member is formed in an outer perimeter thereof with a deflection directing portion that directs light emitted from said light-emitting chip such that the light is deflected toward the optical axis.

6. The light-emitting diode according to claim 1, wherein said sealing member is comprised of:
    a sealing member main body for sealing said light-emitting chip, and
    a cover member attached to said sealing member main body so as to be on a side that faces the forward direction along the optical axis.

7. A vehicular lamp wherein the light-emitting diode according to claims 1 is provided as a light source thereof.

8. A vehicular lamp wherein the light-emitting diode according to claims 6 is provided as a light source thereof.

* * * * *